US011628459B2

(12) United States Patent
Haustein et al.

(10) Patent No.: US 11,628,459 B2
(45) Date of Patent: Apr. 18, 2023

(54) DEVICE FOR PROCESSING A COMPONENT, CARRIAGE FOR THE DEVICE, AND METHOD FOR OPERATING THE DEVICE

(71) Applicant: SCIA SYSTEMS GMBH, Chemnitz (DE)

(72) Inventors: Daniel Haustein, Meerane (DE); Sybille Martin, Chemnitz (DE); Matthias Nestler, Nossen (DE); Michael Zeuner, Chemnitz (DE)

(73) Assignee: SCIA SYSTEMS GMBH, Chemnitz (DE)

( * ) Notice: Subject to any disclaimer, the term of this patent is extended or adjusted under 35 U.S.C. 154(b) by 1010 days.

(21) Appl. No.: 16/348,385

(22) PCT Filed: Nov. 9, 2017

(86) PCT No.: PCT/EP2017/078737
§ 371 (c)(1),
(2) Date: Jul. 10, 2019

(87) PCT Pub. No.: WO2018/087216
PCT Pub. Date: May 17, 2018

(65) Prior Publication Data
US 2019/0329279 A1    Oct. 31, 2019

(30) Foreign Application Priority Data
Nov. 11, 2016   (DE) ..................... 10 2016 121 674.7

(51) Int. Cl.
*B65G 54/02*     (2006.01)
*B05B 13/02*     (2006.01)
(Continued)

(52) U.S. Cl.
CPC .......... *B05B 13/0235* (2013.01); *B65G 54/02* (2013.01); *C23C 14/568* (2013.01);
(Continued)

(58) Field of Classification Search
CPC ...... B05B 13/0235; B65G 54/02; H02K 5/20; H02K 41/033; H01J 37/32733; C23C 14/568
See application file for complete search history.

(56) References Cited

U.S. PATENT DOCUMENTS

| 5,958,193 | A | * | 9/1999 | Brugge | ............... | H01J 37/3408 |
| | | | | | | 204/192.12 |
| 6,012,208 | A |   | 1/2000 | Wiemers | | |
| 6,158,568 | A |   | 12/2000 | Erceg et al. | | |

(Continued)

FOREIGN PATENT DOCUMENTS

| CN | 1861444 A | 11/2006 |
| CN | 101024212 A | 8/2007 |

(Continued)

OTHER PUBLICATIONS

International Application No. PCT/EP2017/078737 International Search Report and Written Opinion dated Feb. 9, 2018.

*Primary Examiner* — John J Brayton
(74) *Attorney, Agent, or Firm* — Sheppard, Mullin, Richter & Hampton LLP

(57) ABSTRACT

The present invention relates to a device for processing a component, comprising: a travel carriage having a frame which defines an axis of translation along which the travel carriage is translationally movable, a bogie which is relatively rotatably connected to the frame and to which the component is attachable, a first translation-permanent magnet device which is mounted on the frame and having permanent magnets, a rotation-permanent magnet device attached to the bogie and having permanent magnets, and a carriage-side longitudinal guide means mounted on the frame, a stationary travel carriage guide device having a guide-side longitudinal guide means, a first electromagnet translation device with electromagnets which magnetically (Continued)

interact with the permanent magnets of the first translation-permanent magnet device, a first rotation-electromagnet device having electromagnets which magnetically interact with the permanent magnets of the rotation-permanent magnet device, and a controller connected to the first translating electromagnet device and to the first rotation-electromagnet device to control its electromagnets to control the translational movement of the travel carriage and the rotational movement of the bogie.

18 Claims, 24 Drawing Sheets

(51) Int. Cl.
 *H02K 41/03* (2006.01)
 *H02K 5/20* (2006.01)
 *C23C 14/56* (2006.01)
 *H01J 37/32* (2006.01)

(52) U.S. Cl.
 CPC ........ *H01J 37/32733* (2013.01); *H02K 5/203* (2021.01); *H02K 41/033* (2013.01)

(56) References Cited

U.S. PATENT DOCUMENTS

| | | | |
|---|---|---|---|
| 6,648,126 B2 * | 11/2003 | Mayer | B65G 54/02 198/465.1 |
| 8,733,541 B2 | 5/2014 | van de Loecht et al. | |
| 9,546,053 B2 | 1/2017 | Hanisch et al. | |
| 9,777,364 B2 | 10/2017 | Chang et al. | |
| 2002/0084170 A1 | 7/2002 | Mayer | |
| 2004/0061383 A1 | 4/2004 | Tsuboi | |
| 2014/0054136 A1 | 2/2014 | Maeda | |

FOREIGN PATENT DOCUMENTS

| | | |
|---|---|---|
| CN | 201703992 U | 1/2011 |
| CN | 102017938 A | 4/2011 |
| CN | 102414098 A | 4/2012 |
| CN | 102867924 A | 1/2013 |
| CN | 103832936 A | 6/2014 |
| CN | 204265007 U | 4/2015 |
| CN | 105073546 A | 11/2015 |
| CN | 204802643 U | 11/2015 |
| CN | 205668808 U | 11/2016 |
| DE | 19628921 | 4/1997 |
| EP | 2543749 | 1/2013 |
| WO | 0068125 | 11/2000 |

* cited by examiner

DEVICE FOR PROCESSING A COMPONENT, CARRIAGE FOR THE DEVICE, AND METHOD FOR OPERATING THE DEVICE

CROSS-REFERENCE TO RELATED APPLICATIONS

This application is a national stage application pursuant to 35 U.S.C. § 371 of International Application No. PCT/EP2017/078737, filed Nov. 9, 2017, which claims priority to German Patent Application No. 10 2016 121 674.7, filed Nov. 11, 2016, the disclosures of which are hereby incorporated by reference herein.

FIELD OF THE INVENTION

The present invention relates to an apparatus for processing (for example for coating and/or stripping) a component and a travel carriage for such a device and a method for operating such a device.

BACKGROUND OF THE INVENTION

Generally, conventional devices are used for coating and/or stripping, generally used for processing a component to apply one or more layers of material of desired thickness on a component and/or remove them from it. Usually, such conventional devices have a number of chambers/stations, into which and/or through which the component is transported, in order to be subjected to certain processing operations. For example, the component is transported from an atmosphere side into a process chamber in which a vacuum predominates and in which the necessary machining operations, for example for coating the component or for removing material from the component, are carried out. After completion of the processing operations, the component is transported out of the process chamber.

There are several conventional approaches to transporting the component to and/or within the chambers and stations. In one conventional technique, for example, a traversing device is used to which the component is attached and to which power supply lines for driving the traversing device are connected (e.g. guided in drag chains) to the traversing device, the supply lines running within the chambers/stations (in particular also within the process chambers having a vacuum).

However, in the case of lines running within the process chambers, outgassing may occur under vacuum and may thereby lead to foreign material contamination and/or particulate contamination of the vacuum and thus deterioration of the vacuum quality (e.g. the minimum pressure achievable by a particular configuration of the apparatus) and of the processing result of the component.

In addition, the lines connected to the conventional traversing device are particularly hindering the transition from areas of different pressure levels (e.g. the transition from atmosphere side to the vacuum side) and usually additional, detachable connections and lines must be provided to the drive system on the vacuum side to provide energy from the atmosphere side, which causes a more complex structure of the device and thus high costs and high workload in manufacturing and assembly of the conventional device.

Further, different drive systems are usually used in different sections (for example, on the atmosphere side, vacuum side, etc.) of the device, which makes a modularized construction of the conventional devices difficult and also leads to high costs and high labor content involved in the manufacture and assembly of conventional devices.

Explanation of the Invention

With the present invention, an apparatus for processing a component, a travel carriage for such a device and a method for operating such a device are provided which at least alleviates some of the aforementioned disadvantages or even completely avoids them.

By the present invention, an apparatus for processing (for example for coating and/or stripping) of a component is provided, comprising: a travel carriage with a frame which defines an axis of translation along which the travel carriage is translationally movable back and forth along a longitudinal direction, a bogie which is connected to the frame rotatably relative to the frame about an axis of rotation and to which the component is attachable, a first translation-permanent magnet device which is mounted on the frame and has arranged along the longitudinal direction permanent magnets, a rotation-permanent magnet device mounted on the bogie, defining a circumferential direction extending around the rotation axis and having permanent magnets arranged along the circumferential direction, and a carriage-side longitudinal guide device attached to the frame, a stationary travel carriage guide device having a guide device-side longitudinal guide means complementary to the carriage-side longitudinal guide device, by means of which the travel carriage is guided translationally, a first translation electromagnet device which is mounted on the travel carriage guide device and has arranged along the longitudinal direction electromagnets which interact magnetically with the permanent magnets of the first translation-permanent magnet device, a first rotation electromagnet device which is mounted on the travel carriage guide device and has arranged along the longitudinal direction electromagnets which magnetically interact with the permanent magnets of the rotating permanent magnet device, and a controller which is connected to the first translation-electromagnet device and to the first rotation-electromagnet device for controlling the electromagnets (e.g. for electrical supply to the electromagnets) in order to control the translational movement of the carriage along the translation axis by means of the magnetic interaction of the electromagnets of the first translation-electromagnet device with the permanent magnets of the first translation-permanent magnet device and to control the rotational movement of the bogie about the axis of rotation by means of the magnetic interaction of the electromagnets of the first rotation-electromagnet device with the permanent magnets of the rotation-permanent magnet device.

The term "translation motion" or "translational motion" is to be understood as meaning not only a (purely) rectilinear forward-backward movement along the translation axis in the longitudinal direction, but also a non-rectilinear or an oscillatory (e.g., exhibiting an oscillation transverse to translational axis) forward-backward movement.

Through the interaction according to the invention of the electromagnetic devices, controlled appropriately by the control device, with the permanent magnet devices for both the translational movement of the carriage and the rotation of the bogie, the present invention provides a travel carriage drive system functioning according to the principle of a linear motor of a device for processing a component, wherein lines connected to the carriage (e.g. drag chains for electrical lines), which are required for a wired energy supply to the carriage, can be completely dispensed with on the vacuum side of the device (e.g. inside of process chambers of the device in which a vacuum prevails), whereby outgassing from the lines and thus a particle contamination of the vacuum can be reduced or substantially prevented. In this way, the vacuum quality in the process chambers and the processing result of the component can be improved.

In addition, it is possible with the present invention to use a uniform drive system in the apparatus according to the invention, for example, for various vacuum side and atmospheric side chambers and stations (for example, process chambers, load lock chambers, balancing stations, component mounting stations, etc.), whereby the provision of different drive systems which can be tailored to operating conditions in the respective chambers and stations can be dispensed with and a modular design of the device is made possible. In addition, a transition between regions of different pressure levels (e.g., an atmosphere side to vacuum side transition through a lock chamber) can be more easily realized. As a result, the scalability and retrofitability of the device as well as the manufacture and assembly of the device (e.g. in terms of cost and labor) can be improved.

In one embodiment, the travel carriage further comprises a second translation-permanent magnet device which is mounted on the frame opposite to (and for example at a distance to) the first translation-permanent magnet device relative to the longitudinal direction and which has holes arranged along the longitudinal direction of the permanent magnets, and the apparatus may further comprise a second translation-electromagnetic device which is mounted on the travel carriage guide device opposite to the (and for example spaced apart from) first translation-electromagnetic device relative to the longitudinal direction and has electromagnets arranged along the longitudinal direction which interact magnetically with the permanent magnets of the second translation-permanent magnet means, wherein the controller further may be connected to the second translation-electromagnetic device for driving the electromagnets of the second translation electromagnetic device (e.g. the electrical energy supply of the electromagnets of the second translation-electromagnetic device) to additionally control the translational movement of the carriage along the translation axis by means of the magnetic interaction of the electromagnets of the second translation-electromagnet device with the permanent magnets of the second translation-permanent magnet device.

In another embodiment, the apparatus may further comprise a second rotation-electromagnetic device which with respect to the longitudinal direction is attached opposite to (and, for example, at a distance from) the first rotation-electromagnetic device on the travel carriage guide device and has electromagnets along the longitudinal direction which magnetically interact with the permanent magnets of the rotation-permanent magnet device, wherein the controller may further be connected to the second rotation-electromagnet device for driving the electromagnets of the second rotation-electromagnet device (e.g. for supplying electrical power to the electromagnets of the rotation-electromagnet device) to control the rotational movement of the bogie as well about the rotation axis by means of the magnetic interaction of the electromagnets of the second rotation-electromagnet device with the permanent magnets of the rotation-permanent magnet device.

By providing additional electromagnet devices and/or permanent magnet devices for translation and/or rotation, the performance (for example, maximum acceleration, maximum speed, maximum drivable mass of travel carriage and component, etc.) of the drive system of the apparatus according to the invention can be increased.

It is to be understood that the device according to the invention also includes other (e.g. a third, a fourth, a fifth, etc.) translation-permanent magnet devices and translation-electromagnet devices which may substantially correspond in structure and operation to the translation-permanent magnet devices described above, as well as other rotation-permanent magnet devices and rotation-electromagnet devices, which in structure and operation substantially follow the above-described rotation permanent magnet devices and are not limited to the number of the aforementioned permanent-magnet devices or electromagnet devices for translation and/or rotation.

The translation-permanent magnet device(s) and/or the rotation-permanent magnet device(s) may comprise a number of differently-poled permanent magnets arranged alternately. For example, each translation-permanent magnet device comprises a number of North Pole permanent magnets (i.e., permanent magnets substantially aligned with the North Pole to the respective translation-electromagnet devices) and a number of South Pole permanent magnets (i.e., permanent magnets substantially aligned with the South Pole to the respective translation-electromagnet devices), which are arranged alternately along the longitudinal direction (e.g., in the order of North Pole permanent magnet, South Pole permanent magnet, North Pole permanent magnet, South Pole permanent magnet, etc.). In addition, the rotation-permanent magnet device may comprise a number of North Pole permanent magnets (i.e., permanent magnets substantially aligned with the North Pole substantially to the respective rotation-electromagnetic device) and a number of South Pole permanent magnets (i.e., permanent magnets substantially aligned with the South Pole to the respective rotation electromagnetic device) which are alternately arranged along the circumferential direction.

In yet a further embodiment the bogie may have: a first wheel which carries the permanent magnets of the rotation-permanent magnet device, a second wheel which is arranged opposite of the first wheel and on which the component is attached, and a shaft which interconnects the first wheel and the second wheel, wherein the travel carriage can have a pivot bearing, e.g. a thrust bearing (for example an axial angular contact ball bearing, an axial spherical roller bearing, etc.), which rotatably connects the shaft to the frame of the carriage. Furthermore, the device can have a fastening device (e.g. a cage structure) by means of which the component can be attached to the bogie (e.g. on the second wheel of the bogie).

For example, the first wheel may be an upper wheel and the second wheel may be a lower wheel, wherein the first and second wheels are stacked and the two wheels are rotatable about a substantially vertical axis of rotation. In this case, coating devices and/or removal devices can be mounted below the second wheel. Alternatively, the first wheel may be a lower wheel and the second wheel may be an upper wheel, wherein the first and second wheels are stacked and the two wheels are rotatable about a substantially vertical axis of rotation. In this case, coating devices and/or removal devices may be mounted above the second wheel. However, it can also be provided that the first wheel and the second wheel are arranged laterally next to each other and with their radial direction extending substantially vertically, wherein the two wheels are rotatable about a substantially horizontal axis of rotation. In this case, coating devices and/or removal devices can be mounted laterally adjacent to the second wheel. Depending on the arrangement of the two wheels described above and corresponding arrangement of the coating devices and/or removal devices, gravitational particle contamination of the component to be processed, the coating device (s) and/or the removal device (s) can be reduced or avoided for the respective application. It is understood that according to the desired arrangement of the two wheels, the other components of the travel carriage and the associated components of the device can be suitably arranged and aligned.

In yet another embodiment, the travel carriage guide device can be formed from a frame structure having spaced-apart lateral brackets along the longitudinal direction, each of said lateral brackets comprising respective lateral posts which, with respect to the longitudinal direction, are arranged opposite from each other (and to each other at a distance) and having a cross member which extends transversely to the longitudinal direction (e.g. in a direction transverse to the longitudinal direction) and connects the posts together, wherein the guide means-side longitudinal guide device can be formed of longitudinal rails which are arranged below the cross member, extend along the longitudinal direction (e.g. extend with their longitudinal extension in the longitudinal direction) and connect the lateral brackets with each other, or of rollers which are arranged below the cross member along the longitudinal direction at a distance from each other. For example, the longitudinal rails or the rollers may be respectively connected to the posts of the frame structure. The longitudinal rails can be arranged directly one after the other (e.g. substantially successively without gaps) and/or be provided along the longitudinal direction with spaces or gaps between respective longitudinal rails. The rollers may be in the form of respective pairs of rollers, the pairs of rollers being spaced along the longitudinal direction.

For example, the frame structure may have individual modules, each module having, for example, two lateral brackets which are connected to one another by means of lateral bracket longitudinal members extending along the longitudinal direction. The individual modules can furthermore be connected to one another by means of connecting longitudinal members extending along the longitudinal direction. The frame structure may include a number (e.g., exactly one, two, three, four, five, or more) of such interconnected modules.

In yet another embodiment, the carriage side longitudinal guide device can have a first carriage-side longitudinal guide device component and a second carriage side longitudinal guide device component, and the guide device side longitudinal guide means can comprise a first guide device-side longitudinal guide means component and a second guide device-side longitudinal guide means component, wherein the first carriage-side longitudinal guide means component and the first guide device-side longitudinal guide means component can be engaged with one another forming a transverse fixed bearing (a transverse fixed bearing (namely, transverse to the longitudinal direction) prohibiting cross-play) and wherein the second carriage-side longitudinal guide means component and the second guide device-side longitudinal guide means component can be engaged with one another to form a transverse floating bearing (a fixed bearing (namely, transverse to the longitudinal direction) permitting cross-play).

Optionally, the first guide device-side longitudinal guide means component may be formed by a first guide-side longitudinal rail extending along the longitudinal direction, and the second guide device-side longitudinal guide means component may be formed of a second guide-device longitudinal rail arranged opposite in the longitudinal direction (and spaced apart, for example) from the first guide device-side longitudinal rail and extending in the longitudinal direction, wherein the first carriage-side longitudinal guide means component engages with at least one roller (e.g. at least one profile roller, for example at least one roller with profiled tread), with the first guide device-side longitudinal rail to form the transverse fixed bearing in a concave-convex engagement preventing cross-play, optionally through carriage-side rollers, opposite with respect to the first guide device-side rail longitudinal rail, (e.g. profile rollers, for example, rollers with profiled tread), which may be formed of the first guide device-side longitudinal rail to form the transverse fixed bearing in a concave-convex engagement preventing cross-play, and the second carriage-side longitudinal guide means component engages at least one roller (e.g., at least one cylindrical roller, for example, at least one roller with a spherical tread) with the second guide-side longitudinal rail to form the transverse floating bearing in an engagement allowing cross-play, optionally formed by the second carriage-side rollers opposite relative to the second guide-side longitudinal rail (e.g. cylindrical rollers or plan rollers, for example rollers with spherical tread), which are engaged with the second guide device-side longitudinal rail to form the transverse floating bearing in a manner that permits cross-play. The travel carriage guide device may, for example, comprise a number of first and a number of second guide device-side longitudinal rails, wherein at least a part or all of the several of first guide device-side longitudinal rails may each be arranged directly consecutively (e.g. substantially successively without gaps) and/or can be provided along the longitudinal direction with spaces or gaps between respective longitudinal rails and wherein at least a part or all of the number of second guide device-side rails may be arranged in respectively immediate succession (e.g., substantially gaplessly consecutively) and/or can be provided along the longitudinal direction with spaces or gaps between respective longitudinal rails.

Optionally, the first carriage-side longitudinal guide means component can be formed by a first carriage-side longitudinal rail which extends along the longitudinal direction, and the second carriage-side longitudinal guide means component can be formed by a second carriage-side longitudinal rail which is arranged opposite with respect to the longitudinal direction from (and, for example, at a distance from) the first carriage-side longitudinal rail and extends in the longitudinal direction, wherein the first guide device-side longitudinal guide means component can be formed by at least one roller (e.g. at least one profile roller, for example at least one roller with a profiled running surface) which engages with the first carriage-side longitudinal rail to form the transverse fixed bearing in a concave-convex engagement which prevents cross-play, optionally which can be formed by the first guide device-side rollers (e.g. profile roller, for example, rollers with profiled tread) opposite with respect to the first carriage-side longitudinal rail, which engage with the first carriage-side longitudinal rail to form the transverse fixed bearing in a concave-convex engagement that prevents cross-play, and the second guide device-side longitudinal guide means component can be formed by at least one roller which engages with the second carriage-side longitudinal rail forming the transverse floating bearing in an engagement that permits cross-play, optionally by the second carriage-side rollers opposite the second carriage-side longitudinal rail, which are engaged with the second carriage-side longitudinal rail to form the transverse floating bearing in an engagement permitting cross-play. The guide device side rollers may be spaced along the longitudinal direction and may optionally be in the form of respective pairs of rollers (e.g. with two respective rollers opposite the second carriage-side longitudinal rail), the pairs of rollers being spaced along the longitudinal direction.

The transverse floating bearing can compensate for transverse movements or transverse displacements of the travel carriage (e.g. transverse movements or transverse displacements caused by thermal material expansion or thermal material contraction), the transverse fixed bearing ensuring safe and precise guidance of the travel carriage during the translational movement of the traveling carriage. If, for example, for cleaning and vacuum preparation of the carriage and the component they are previously heated together in the device (e.g. in a corresponding chamber of the device) to a predetermined heating temperature (e.g. to more than 100° C.), the transverse floating bearing in the device according to the invention can compensate in an advantageous manner for the occurring relatively large material expansions and material contractions.

Furthermore, the rollers can support the carriage against the weight of the carriage and the component on the longitudinal rails. In addition, with an array of rollers opposed to the respective longitudinal rail, the travel carriage can be supported on the longitudinal rails against the attractive forces acting between the translation-permanent magnet devices and the translation-electromagnet devices and acting between the rotation-permanent magnet device and the rotation-electromagnet devices. As a result, for example, a gap between the electromagnetic devices and the permanent magnet device can be kept substantially constant in order to ensure reliable operation of the drive system (e.g. reliable magnetic interaction of the electromagnetic devices and the permanent magnet device).

In yet another embodiment, the electromagnets of the first and/or the second translation-electromagnet device and/or the electromagnets of the first and/or the second rotation-electromagnet device may each comprise a housing in which electromagnet coils of the electromagnets are accommodated, wherein coolant channels are formed in the housing, to which a coolant supply is connected or is connected to supply the housing coolant for cooling the electromagnet coils. The housing may be configured such that a housing interior is airtight to the environment. The electromagnet coils of the electromagnets may for example be embedded or cast in the housing by means of a casting material, for example by means of a casting resin. Furthermore, a respective (e.g. each) electromagnet can have a plurality of electromagnet coils which are separated from one another and which can be controlled individually by the controller (for example, can be supplied with electrical energy).

In yet another embodiment, the device may further comprise: one or more processing chambers, a vacuum device (for example, having one or more vacuum pumps), by means of which one or more process chambers can be evacuated, wherein one or more coating devices (such as one or more sputter-coating devices, each having, for example, one or more magnetron devices (e.g., sputter plasma devices)) by which the component can be coated, are arranged within the one or more process chambers, and/or one or more removal devices (e.g., one or more sputter removal devices; each having, for example, one or more sputtering plasma devices) by means of which material can be removed from the component, are arranged within the one or more process chambers, wherein the travel carriage guide device with the attached respective translation-electromagnet device and attached thereto respective rotation-electromagnet device extends at least partially (e.g. completely) within the one or more process chambers, so that the travel carriage guided by the travel carriage guide device is translationally movable within the one or more process chambers along the translation axis by means of the respective translation electromagnet device and the bogie of the carriage is rotatable about the rotation axis within the one or more process chambers by means of the respective rotation-electromagnet device.

For example, the components of the frame structure of the travel carriage guide device can be arranged on the vacuum side within the one or more process chambers so that they are only on the process chamber bottom and at least partially or substantially are completely decoupled or separated from the process chamber walls (e.g. process chamber sidewalls) forming the process chamber(s). In this way, it can be avoided that movements (e.g. due to deformations of the process chamber walls arising during vacuum generation) are transmitted from the one or more process chambers to the frame structure and thus also to the travel carriage and the accuracy of the translation movement of the travel carriage and the rotational movement of the carriage bogie is negatively affected.

Moreover, the apparatus may still have further chambers/stations, for example, one or more lock chambers for the transition from the atmosphere side to the vacuum side (for example, by pumping out of the lock chamber to a pressure which lies close to the pressure of the vacuum in the one or more process chambers), one or more vacuum preparation chambers (e.g., for preparing (e.g., by heating) the carriage and/or the vacuum component), one or more balancing stations, one or more component mounting stations, and one or more valve devices configured to selectively couple two chambers together to allow the carriage to move between the two chambers and to selectively seal the two chambers air-tight. The other chambers can also combine several functions. For example, the lock chamber can be set up for preparing the carriage and the component for the vacuum and to transition from the atmosphere side to the vacuum side.

In yet another embodiment, at least a longitudinal brake rail can be connected to the frame of the travel carriage, the longitudinal brake rail extending along the longitudinal direction, wherein the travel carriage guide device may comprise at least one brake shoe device (for example, several brake shoe assemblies) having brake shoes arranged on both sides of the longitudinal brake rail, by means of which the longitudinal brake rail can be clamped to generate a braking force. The at least one brake shoe device can be set up, for example, to perform a deceleration of the carriage in a predetermined error situation (e.g. when an emergency stop switch is actuated and/or in the event of a power failure, etc.). By the at least one brake shoe device being mounted on the stationary travel carriage guide device and not on the travel carriage (or carriage side), it is not necessary to supply the travel carriage additional energy for operating a car-side brake shoe device via lines (e.g. via the aforementioned drag chains).

In yet another embodiment, the device may further comprise at least one translation-measuring device for non-contact measurement of the translational movement of the travel carriage and at least one rotation-measuring device for non-contact measuring the rotation of the bogie, which are respectively connected to the controller, wherein the controller further can be adapted to receive from the at least one translation-measuring device signals which have information regarding a translation path (or a translation position)

and a translation direction of the carriage, and to receive signals from the at least one rotation-measuring device which have information regarding an angle (or a rotational path) and/or a rotation speed and/or a rotation direction (for example, but not limited to, the angle and the rotation direction or the rotation speed and the rotation direction) of the bogie of the carriage.

The at least one translation measuring device can be configured to detect the translation path (or the translation position) and the translation direction of the travel carriage in a magnetic manner and/or in an optical manner. For example, the at least one translation measuring device may comprise (or be designed as) a magnetic (e.g., magnetostriction-based) translation detection device having a (permanent) magnetic position sensor mounted laterally on the carriage (e.g., fixed) and a (e.g., fixed) magnetic sensor which magnetically interacts with the magnetic position sensor to determine the translation path (or the translation position) and the translation direction of the carriage. Furthermore, the at least one translation measuring device may comprise (or be designed as) an optical translation detection device which has a scale (e.g., a glass scale, a stainless steel scale) attached laterally to the carriage (e.g., lengthwise) and having bars and gaps between the bars (e.g. in the form of an absolute coding) and an optical scanning head attached to the travel carriage guide device (e.g. fixed), which is adapted to scan the scale (e.g. the bars and gaps of the scale), in order to determine the translational path (or the translational position) and to determine the translation direction of the carriage.

The at least one rotation measuring device may be adapted to detecting the angle (or the rotation path) and/or the rotation speed and/or the rotation direction (for example, but not limited to, the angle and the rotation direction or the rotation speed and the rotation direction) of the bogie in an optical manner by means of a (e.g. with respect to the travel carriage) stationary sensor device. By way of example, the at least one rotation measuring device can have an optical incremental measuring device (or incremental encoder) or have an optical absolute value measuring device or can be designed as such.

In one example, the at least one rotation measuring device may have a (with respect to the travel carriage) stationary sensor device (which has, for example, at least one reflected light barrier, for example at least or exactly two reflected light barriers) and a reflecting device, wherein the stationary sensor device is set up to emit at least one (e.g. at least or exactly two) light beam(s) (e.g. at least one laser beam, for example, at least or exactly two laser beams) in the direction of the carriage, to receive at least one light beam reflected in pulses by the reflecting device (e.g. at least or exactly two light beams reflected in pulses), and on the basis of the at least one pulsed reflected light beam to determine an angle (or a rotation path) and/or the rotational speed and/or the rotational direction of the bogie, and wherein the reflecting device (e.g. on the first wheel of the bogie) is mounted on the bogie and is adapted to reflect at least one incident light beam during rotation of the bogie pulse-wise (or in the form of pulses). For example, the reflecting device for this purpose has a mirror attached to the frame of the carriage (e.g. fixed) to which the at least one light beam of the stationary sensor device is directed, and a coding device (e.g. a coding disk) extending along the circumferential direction and rotationally fixed to the bogie, the coding device being arranged in a path of the light beam (e.g., the non-reflected and the reflected light beam) between the mirror and the stationary sensor device and has a plurality of slots, wherein the reflecting device is adapted to reflect at least one light beam striking the reflecting device through the plurality of slots upon rotation of the bogie in pulses according to the direction of rotation and/or the angle (or rotation path) and/or the rotational speed.

The at least one rotation measuring device may in another example be a stationary (e.g. with respect to the travel carriage) sensor device, a stationary light beam transmitting device opposite the sensor device (e.g. with respect to the carriage) (e.g. which has at least one light beam source, for example at least or exactly two light beam sources) and a coding device (for example a coding disk) connected in a rotationally fixed manner to the bogie, the stationary light beam transmitting device being adapted to emit at least one light beam (e.g. at least or exactly two light beams) towards the stationary sensor device, the travel carriage moving between the stationary sensor device and the stationary light beam transmitting device, so that the coding device is arranged in a path of the at least one light beam between the stationary light beam transmitting device and the stationary sensor device, the encoder has a plurality of slots and is adapted to let through the at least one light emitted by the stationary light beam transmitting device during rotation of the bogie, generating light pulses corresponding to the direction of rotation and/or the angle (or rotation path) and/or rotational speed of the bogie by means of the plurality of slots toward the stationary sensor device through the plurality of slots, and the stationary sensor device is adapted to receive the generated light pulses and to determine an angle from the received light pulses (or a rotation path) and/or to determine the rotational speed and/or the direction of rotation of the bogie.

In yet another example, the at least one rotary measurement device may be a (for example, with respect to the travel carriage) stationary sensor device, a travel carriage light beam transmitting device attached to the travel carriage (which has, for example, at least one light beam source, for example, at least or exactly two light beam sources) and a coding device rotatably connected to the bogie (e.g. a coding disk), wherein the travel carriage light beam transmitting device is adapted to emit at least one light beam (e.g. at least or exactly two light beams) in the direction of the stationary sensor device, the encoder is arranged in a path of the at least one light beam between the travel carriage light beam transmitting device and the stationary sensor device and having a plurality of slots and is adapted to let through at least one light beam transmitted by the travel carriage light emitting device during a rotation of the bogie, to generate light pulses corresponding to the rotation direction and/or the angle (or rotation path) and/or the rotational speed of the bogie by means of the plurality of slots toward the stationary sensor device, and the stationary sensor device is adapted to receive the generated light pulses and based on the received light pulses to determine an angle (or a rotation path) and/or determine the direction of rotation and/or the rotational speed of the bogie. For example, the travel carriage light beam emitting device may include a battery (e.g., a replaceable battery) for supplying electrical energy and/or may be configured to draw its electrical energy required for operation from the magnetic field of the translation-electromagnetic devices and/or the rotation-electromagnetic devices.

Additionally or alternatively, the at least one rotation-measuring device can have a travel carriage rotation detection device mounted on the travel carriage and a receiving unit coupled to said controller, wherein the attached travel carriage rotation detection device is adapted to set the angle and/or to detect the rotation speed and/or the direction of rotation of the bogie and to transmit the detected angular and/or the detected rotational speed and/or the detected direction of rotation of the bogie wirelessly to the receiver unit, and wherein the receiving unit is adapted to transmit the received information about the angle and/or the rotational speed and/or the direction of rotation of the bogie to the control unit. The travel carriage rotation detection device may for example be adapted to detect the angle (or the rotation path) and/or the rotational speed and/or the rotational direction of the bogie in any way, for example, preferably in an optical and/or magnetic manner to detect and transmit the detected angle and/or the detected rotational speed and/or the detected rotational direction of the bogie to transmit as data via a radio link to the receiving unit. The travel carriage rotation detection device may, for example, have a battery mounted on the travel carriage (e.g., a removable battery) for supplying electrical energy and/or may be adapted to draw the electrical energy required for their operation from the magnetic field of the translation electromagnet devices and/or rotation-electromagnet devices.

It is also possible that various examples of the at least one rotation measuring device described above is used at least in combination. For example, the rotation of the bogie can be measured optically (e.g. by means of one of the examples of optical measurement described above) and at the same time the rotation of the bogie can be measured by means of a travel carriage rotation detection device and the angle detected by the travel carriage rotation detection device and/or the detected rotation speed and/or the rotational direction detected by the travel carriage rotation detection device of the bogie are wirelessly transmitted to a receiving unit connected to the control unit receiving unit and wherein the receiving unit, transmits the received information about the angle and/or rotation speed and/or the direction of rotation of the bogie to the control unit.

The controller may have a translation controller which is connected to the translation-electromagnet device(s) and is adapted to control the translational movement of the travel carriage, and a rotation controller, which is connected to the rotation-electromagnet device(s) and which is adapted to control the rotation of the bogie. Furthermore, the controller may comprise a superimposed controller (e.g. a control unit with a processor) which is connected to the translational controller and the rotation controller and which is adapted to generate and transmit corresponding control signals to the translational controller and the rotation controller in order to control the translational movement of the travel carriage and to control the rotation of the bogie in a superimposed manner (and thus to produce a superimposed movement of the translational movement and the rotation of the component). The translational controller has, for example, first translation converter devices which are respectively connected to associated electromagnets of the first translation electromagnet device and are adapted to supply the associated electromagnets of the first translation electromagnet device with electrical energy, so that a translational movement of the carriage along the translation axis is generated, and the translation controller may further comprise second translation conversion devices, which are respectively connected to associated electromagnets of the second translation electromagnet device and adapted to supply the associated electromagnets of the second translation electromagnet device of the translation control means with electrical energy, so that a translational movement of the travel carriage along the translation axis is generated. The rotation controller comprises, for example, first rotation-inverter devices respectively associated with respective electromagnets of the first rotation electromagnet device and adapted to supply electric power to the associated electromagnets of the first rotation electromagnet device in order to generate rotation of the bogie about the rotation axis, and the rotation controller may further comprise second rotation-inverter device respectively connected to associated electromagnets of the second rotation electromagnet device and arranged to supply electric power to the associated electromagnets of the second rotation electromagnet device so that rotation of the bogie is generated around the axis of rotation. The first translation inverter device and the second translation inverter device may be arranged to operate in pairs in a master-slave mode (e.g., in a respective pair of first translation inverter device and a second translation inverter device, the first translation inverter device works as a master and the second translation inverter device as a slave or vice versa). The same applies equally to the first rotation inverter devices and the second rotation inverter devices. Each of the aforementioned inverter devices may include an inverter (e.g., a frequency converter) connected to the electromagnet coils of the electromagnets of the associated electromagnet device and configured to supply electrical power to the electromagnet coils of the electromagnets of the associated electromagnet device, and a frequency converter control unit (e.g., with a control processor) which is connected to the associated inverter and is adapted to supply the associated inverter control signals to control the power supply of the electromagnet coils in response to the control signals by means of the inverter.

By the present invention, a travel carriage for an apparatus such as described herein for processing a component is further provided, comprising: a frame which defines an axis of translation along which the travel carriage translationally is movable forward and backward along a longitudinal direction, a bogie rotatably connected to the frame about a rotation axis relative to the frame and to which the component is attachable, a first translation-permanent magnet device mounted on the frame and having permanent magnets arranged along the longitudinal direction, which can interact with electromagnets of a first translation-electromagnet device of the apparatus, a rotation-permanent magnet device, which is connected to the bogie, defines a circumferential direction extending around the rotation axis and having permanent magnets arranged along this circumferential direction which can interact with electromagnets of a first rotation-electromagnet device and/or a second rotation-electromagnet device of the apparatus, and a carriage-side longitudinal guide means which can cooperate with a complementary guide device-side longitudinal guide means of a stationary travel carriage guide device of the apparatus, so that the travel carriage can be guided translationally on the travel carriage guide device.

In one refinement, the travel carriage can furthermore have a second translation-permanent magnet device which is attached to the frame opposite the (and e.g. at a distance from) first translation-permanent magnet device and which has permanent magnets arranged along the longitudinal direction which can interact with a second translation-electromagnet device of the apparatus.

The present invention provides a method for operating a device, moreover, wherein the controller controls at least one of the translational electromagnet devices and/or at least one of the rotation electromagnet devices so that the travel carriage moves in a uniform moving way or in a non-uniform manner translationally and/or rotates the bogie in a uniform manner or in a non-uniform manner and thereby a superimposed movement of translational movement and rotation of the component is generated.

In one embodiment, for example, the controller can control the translational movement of the carriage and the rotation of the bogie in a superimposing manner in such a way that a constant rotational speed of the component is generated in a direction of rotation at a varying translational speed of the component.

In another embodiment, for example, the control device can control the translational movement of the travel carriage and the rotation of the bogie in a superimposing manner in such a way that a constant speed of translation of the component is produced in a rotational direction at a varying rotational speed of the component.

In a further embodiment, the control device can receive signals which have information regarding a translational path and a translational direction of the carriage from at least one translation-measuring device for non-contact measurement of the translational movement of the carriage and signals which contain information regarding an angle (or a rotation path) and/or a rotational speed and/or a rotational direction of the bogie of the carriage, obtained by at least one rotation-measuring device for non-contact measuring the rotation of the bogie and the controller can control a translational movement of the carriage in response to the signals of the at least one translation-measuring device and control a rotation of the bogie in response to the signals from the at least one rotation measuring device.

Additionally, in a still further embodiment, the at least one rotation measuring device can detect the angle (or the rotational path) and/or the rotation speed and/or the direction of rotation of the bogie in optical manner by means of a stationary sensor device, wherein a measuring distance of the stationary sensor device to the bogie changes in response to the translational movement of the travel carriage, and/or the at least one rotation measuring device has a travel carriage rotation detection device mounted on the travel carriage and a receiving unit, wherein the travel carriage rotation detection device detects the angle and/or the detected rotational speed and/or the direction of rotation of the bogie and transmits the detected angle and/or the detected rotational speed and/or the detected direction of rotation of the bogie wirelessly to the receiving unit.

In addition, in a still further embodiment, the at least one translation measuring device can detect the translation path and the translation direction of the carriage in a magnetic manner and/or in an optical manner.

In this application, in reference to the invention, when referring to "a component", "a travel carriage", "bogie", this does not mean that the invention is limited to "exactly one component", "just one travel carriage" or "exactly one bogie", but rather instead means that more of the aforementioned parts and components may be present. For example, the device may also have a number of carriages. Furthermore, at least one or each carriage can be set up to hold a number of components, for example by the respective carriage having a number of bogies. In providing a number of bogies, these may also be adapted to rotate independently of each other (e.g. by appropriate control of the rotation-permanent magnet devices), or may also be coupled together (e.g. via transmitters) so that they simultaneously turn in the same direction of rotation and/or with rotate at the same rotational speed.

BRIEF DESCRIPTION OF THE DRAWINGS

Embodiments of the invention are illustrated in the figures and are explained in more detail below, whereby for reasons of clarity not every figure always shows all the features of the invention, but certain features cannot be shown.

DETAILED DESCRIPTION

In the following detailed description, reference is made to the accompanying drawings, which form a part hereof, and in which specific embodiments in which the invention may be used are shown by way of illustration. In this regard, directional terminology such as "top", "bottom", "front", "back", "forward", "backward", etc. is used with reference to the orientation of the described figure(s). Since components of examples and embodiments can be positioned in a number of different orientations, the directional terminology is illustrative and is in no way limiting. It should be understood that other examples and embodiments may be utilized, and structural or logical changes may be made without departing from the scope of the present invention. It should be understood that the features of the various examples and embodiments described herein may be combined with each other unless specifically stated otherwise. The following detailed description is therefore not to be taken in a limiting sense, and the scope of the present invention is defined by the appended claims.

As used herein, the terms "joined," "connected," and "coupled" are used to describe both a direct and an indirect joining, a direct or indirect connection, and a direct or indirect coupling. In the figures, identical or similar elements are provided with identical reference signs, as appropriate.

With reference to the figures, an apparatus 1 for processing a component 3 has a travel carriage 10.

Figure 2:
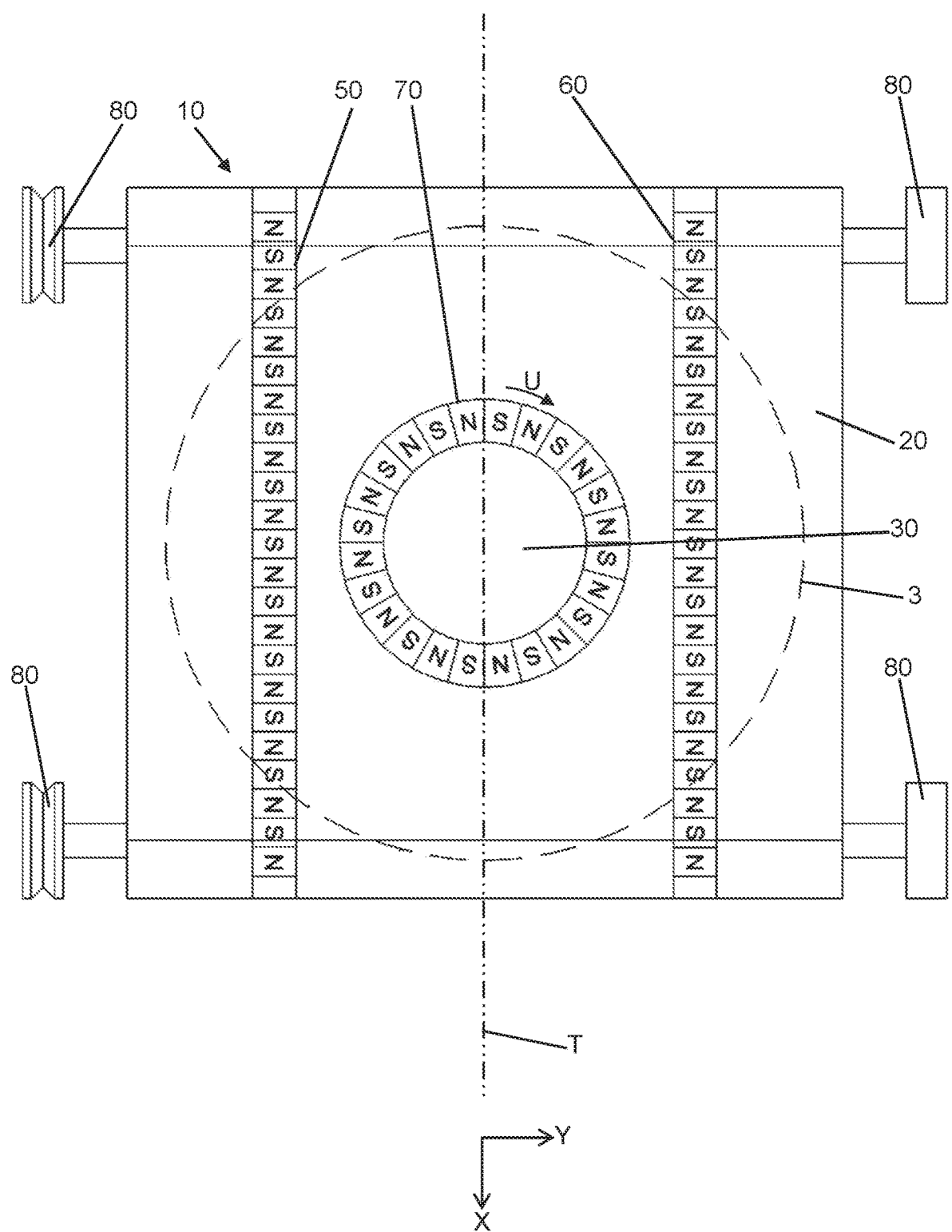
FIG. 2 is a plan view of an exemplary travel carriage for an apparatus according to the present invention.
Figure 4:
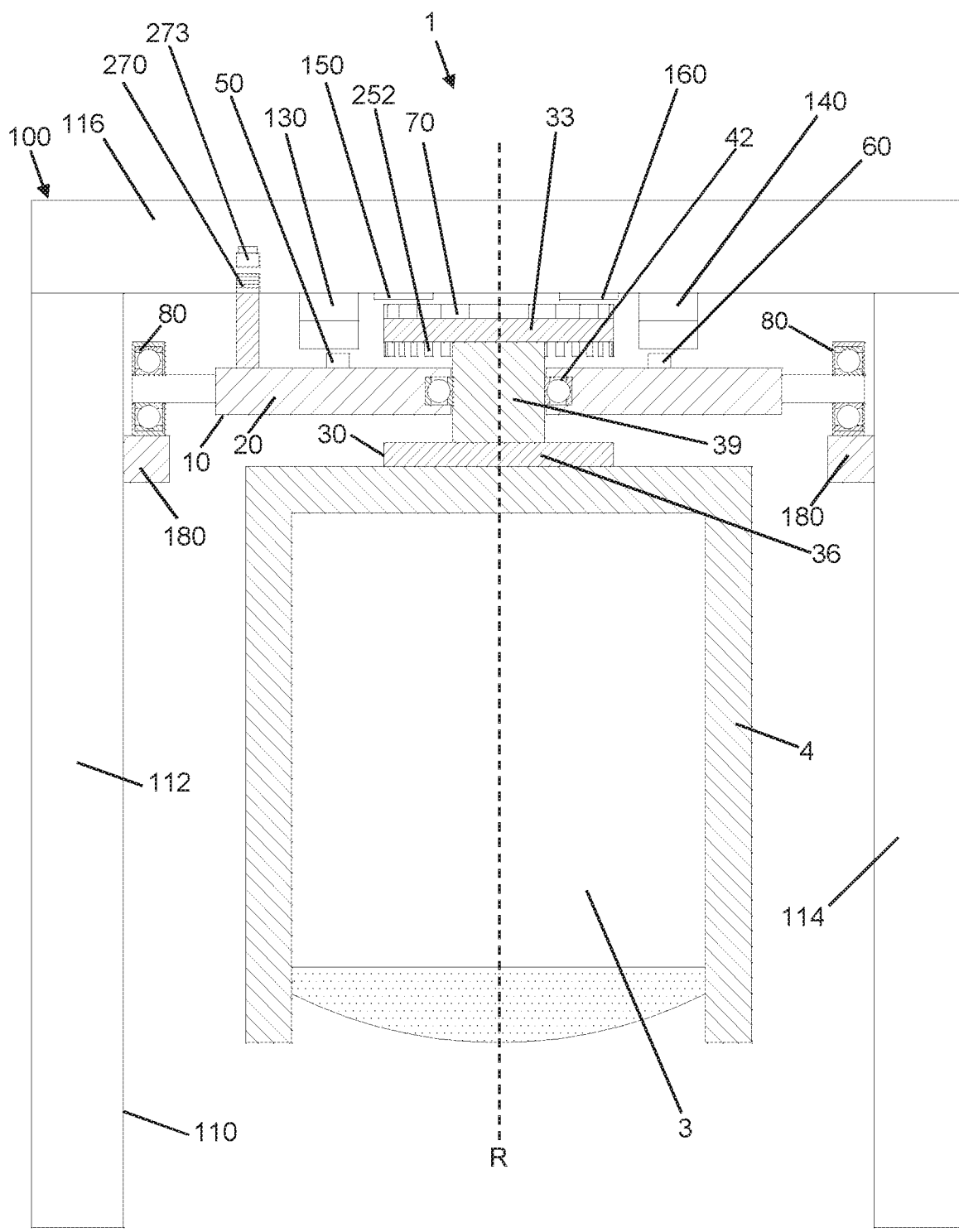
FIG. 4 is a cross-sectional view through an exemplary apparatus for processing a component according to the present invention.

The travel carriage 10 comprises, for example shown in more detail in FIGS. 2 and 4, a frame 20 which defines a translation axis T along a longitudinal direction X, along which the travel carriage 10 is translationally movable forward and backward. The carriage 100 further comprises a bogie 30 which is rotatable relative to the frame 20 about a rotation axis R connected to the frame 20 and to which the component 3 is attachable. The bogie 30 includes, for example, a first wheel (e.g., an upper wheel) 33, a second wheel (e.g., a lower wheel) 36, which is arranged opposite the first wheel 33 and to which the component 3 is attachable, and a shaft 39 connecting the first wheel 33 and the second wheel 36 to each other. For example, the frame 20 may have a central through opening through which the shaft 39 passes, such that the first wheel 33 is arranged on a first side (e.g. above) of the frame 20 and the second wheel 36 on a second side (e.g. below) of the frame 20. The component 3 can be attached to the second wheel 33 of the bogie 30 by means of a fastening device 4, which is formed e.g. in the form of a cage structure and is connected to the component 3 (e.g. fixed). The carriage 10 further comprises a pivot bearing 42, for example a thrust bearing (for example an axial angular contact ball bearing, an axial spherical roller bearing, etc.), which rotatably connects the shaft 39 to the frame 20 of the carriage 10.

Although illustrated as a block-shaped body in the figures of the frame 20, this is not limited to such a configuration and the frame 20 may be formed in numerous ways. For example, the frame 20 can also be formed from a number of separate frame carriers, which extend, for example, respectively in the longitudinal direction X and the transverse direction Y and are connected to each other to form the frame 20.

The travel carriage 10 further comprises a first translation-permanent magnet device 50, which is attached to the frame 20 (for example on an upper side thereof) and which has permanent magnets arranged along the longitudinal direction X. In addition, the travel carriage 10 may include a second translation-permanent magnet device 60 mounted on the frame 20 (e.g., at an upper side thereof) with respect to the longitudinal direction X opposite (and e.g. spaced apart from) the first translation-permanent magnet device 50 and has permanent magnets arranged along the longitudinal direction X.

In addition, the travel carriage 100 has a rotation-permanent magnet device 70 which is mounted on the bogie 30, defines a circumferential direction U extending around the axis of rotation R, and has permanent magnets arranged along this circumferential direction U. For example, as shown in more detail in FIG. 4, the first wheel 33 (e.g., at an upper side thereof) supports the permanent magnets of the rotation-permanent magnet device 70.

The first and second translation-permanent magnet devices 50 and 60 and the rotation-permanent magnet device 70 comprise, for example, a number of differently polarized permanent magnets which are arranged alternately. For example, both the first and second translation-permanent magnet devices 50 and 60 have a number of North Pole permanent magnets (i.e., permanent magnets substantially aligned with the North Pole relative to the respective translation-electromagnet device) and a number of South Pole permanent magnets (i.e., permanent magnets aligned substantially with the South Pole relative to the respective translation-electromagnet device) (in FIG. 2 illustrated by the letter "N" for the North Pole permanent magnets and "S" for the South Pole permanent magnets), which are arranged alternately along the longitudinal direction X (e.g. in the sequence shown in FIG. 2, North pole permanent magnet N, South Pole permanent magnet S, North Pole permanent magnet N, South Pole permanent magnet S, etc.). In addition, the rotation-permanent magnet device 70 includes, for example, a number of North Pole permanent magnets N (i.e., permanent magnets substantially aligned with the North Pole to the respective rotation-electromagnet device) and a number of South Pole permanent magnets S (i.e., permanent magnets substantially aligned with the South Pole to the respective rotation-electromagnet device), which are arranged alternately along the circumferential direction U (e.g., also in the order mentioned above), as illustrated in FIG. 2. The permanent magnets of the first and second translation-permanent magnet devices 50 and 60 and of the rotation-permanent magnet device 70 may be formed from a permanent magnet material, in particular a vacuum-suitable permanent magnet material. By way of example and not limited thereto, neodymium-iron-boron (NdFeB) and samarium-cobalt (SmCo) are mentioned here as possible permanent magnet materials.

The device 1 furthermore has a stationary travel carriage guiding device 100. The travel carriage guide device 100 is formed according to the present invention, for example, of a frame structure having, along the longitudinal direction X, lateral brackets 110 spaced from each other, which respectively have lateral posts 112 and 114 (e.g. two lateral posts per lateral bracket), which are arranged opposite each other with respect to the longitudinal direction X (and spaced from each other), and have a cross member 116 which extends transversely to the longitudinal direction X (or substantially along the transverse direction Y) and connects the posts 112 and 114 with each other.

Figure 3:
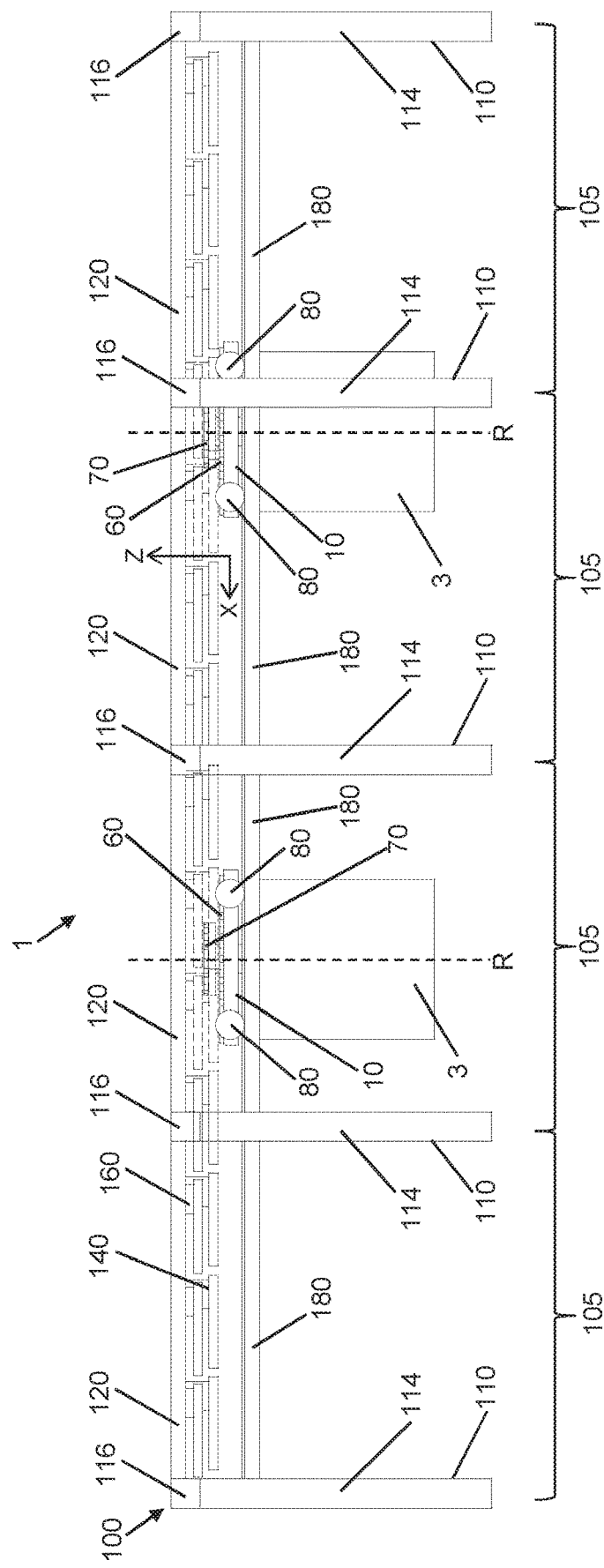
FIG. 3 is a side view of an exemplary apparatus for processing a multi-module device according to the present invention.

The frame structure includes, for example, individual modules 105 (as shown in FIG. 3), each module 105 having two lateral brackets 110 connected to each other by lateral bracket longitudinal members 118 and 120 extending along the longitudinal direction X. As shown particularly in FIG. 1, a first lateral bracket longitudinal beam 118 and a second lateral bracket longitudinal beam 120 connect two lateral brackets 110 of a respective module 105. Other lateral bracket longitudinal beams can also be provided at different heights for connecting the lateral brackets of respective modules to further increase the stability of the frame structure.

The device 1 comprises a first translation-electromagnet device 130, which is attached to the travel carriage guide device 100 (e.g., on the cross members 116 of the lateral brackets 100) and electromagnets 133 are arranged along the longitudinal direction X, which interact magnetically with the permanent magnets of the first translation-permanent magnet device 50. The device 1 further comprises, for example, a second translation-electromagnet device 140, which is mounted with respect to the longitudinal direction X opposite (and e.g. at a distance from) the first translation-electromagnet device 130 on the travel carriage guide device 100 (e.g., on the cross members 116 of the lateral brackets 100), and which has electromagnets 143 arranged along the longitudinal direction X, which magnetically interact with the permanent magnets of the second translation-permanent magnet device 60. In addition, the device 1 comprises a first rotation-electromagnet device 150, which is attached to the travel carriage guide device 100 (e.g. to the cross members 116 of the lateral brackets 100) and which has electromagnets 153 arranged along the longitudinal direction X which interact magnetically with the permanent magnets of the rotating permanent magnet device 70. The apparatus 1 according to the present invention further comprises a second rotation-electromagnet device 160, which is attached opposite to the (at a distance to) the first rotation-electromagnet device 150 on the travel carriage guide device 100 (e.g. on the cross members 116 of the lateral brackets 100) with respect to the longitudinal direction X and has electromagnets 163 arranged along the longitudinal direction X which interact magnetically with the permanent magnets of the rotation-permanent magnet device 70.

Figure 1:
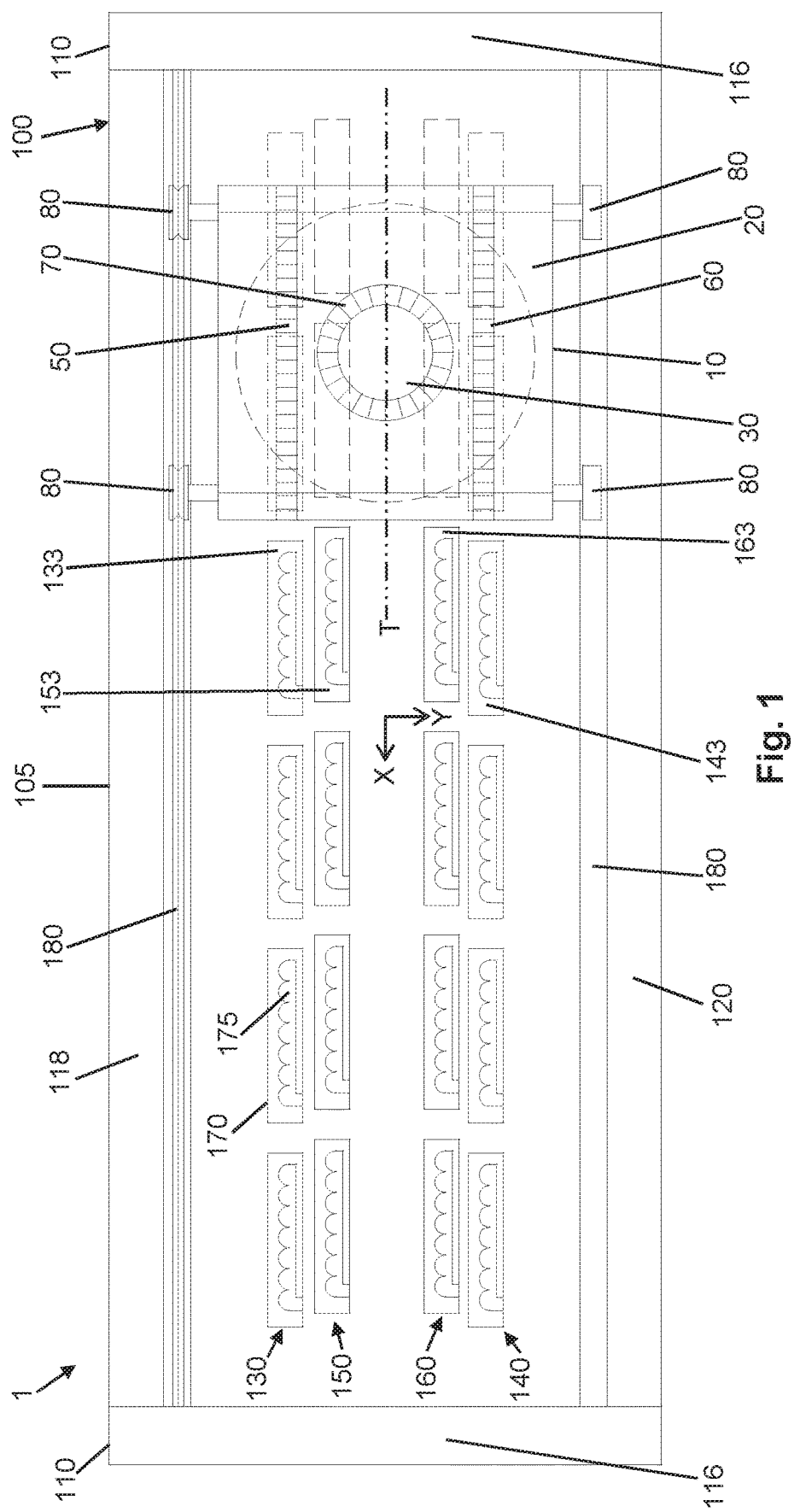
FIG. 1 is a plan view of an exemplary apparatus for processing a component according to the present invention.

The electromagnets 133, 143 of the first and/or the second translation-electromagnet device 130, 140 and/or the electromagnets 153, 163 of the first and/or the second rotary electromagnet device 150, 160 may each have a housing 170 (indicated in FIG. 1 for better clarity, for example, only by a reference numeral on a electromagnet device). The housing 170 may be configured such that a housing interior is airtight to the environment. The housing 170 includes, for example, a base plate, a coil cover attached to the base plate (e.g., fixed), and a gasket provided between the base plate and the coil cover. The housing contains electromagnet coils 175 (in FIG. 1 for clarity, for example, only indicated by a reference numeral on a electromagnet device) of the respective electromagnet. Further, coolant channels are formed in the housing 170, to which a coolant supply can be connected or is connected, in order to supply the housing 170 to with coolant for cooling the electromagnet coils 175.

The electromagnets 133 of the first translation-electromagnet device 130 may be arranged on a first level in the vertical direction Z (see FIG. 3) such that a suitable predetermined air gap exists between the electromagnets 133 of the first translation electromagnet device 130 and the permanent magnets of the first translation-permanent magnet device 50 to allow a magnetic interaction of the magnetic fields generated by the electromagnets and the permanent magnets. The electromagnets 143 of the second translation-electromagnet device 140 may also be arranged at the first level so that there is a suitable predetermined air gap between the electromagnets 143 of the second translation-electromagnet device 140 and the permanent magnets of the second translation-permanent magnet device 60 to enable magnetic interaction of the magnetic fields generated by the electromagnet and the permanent magnets. However, it is also possible that the electromagnets 133, 143 of the first and second translation electromagnetic devices 130, 140 (e.g., due to a different position of their associated translation-permanent magnet device) are arranged at different levels in the vertical direction.

The electromagnets 153 of the first rotation-electromagnet device 150 may be arranged at a second level in the vertical direction so that a suitable predetermined air gap exists between the electromagnets 153 of the first rotation-electromagnet device 150 and the permanent magnets of the rotation-permanent magnet device 70 to enable magnetic interaction of the magnetic fields generated by the electromagnets and the permanent magnets. The electromagnets 163 of the second rotation-electromagnet device 160 may also be arranged at the second level, so that a suitable, predetermined air gap between the electromagnets 163 of the second rotation-electromagnet device and the permanent magnets of the rotation-permanent magnet device 70 is present to enable magnetic interaction of magnetic fields generated by the electromagnets and the permanent magnets. The first level and the second level may be different from one another, but are not limited to this.

The device 1 according to the present invention further comprises a controller 200 which is connected to the first and the second translation electromagnet devices 130, 140 and to the first and second rotation-electromagnet devices 150, 160 for driving the electromagnets thereof, in order to control the translational movement of the carriage 10 along the translation axis T by means of the magnetic interaction of the electromagnets 133 of the first translation-electromagnet device 130 with the permanent magnets of the first translation-permanent magnet device 50 and/or the magnetic interaction of the electromagnets 143 of the second translation-electromagnet device 140 with the permanent magnets of second translation-permanent magnet device 60 and to control the rotational movement of the bogie 30 about the axis of rotation R by means of the magnetic interaction of the electromagnets 153 of the first rotation-electromagnet device 150 with the permanent magnets of the rotation-permanent magnet device 70 and/or the magnetic interaction of the electromagnets 163 of the second rotational electromagnet device 160 with the permanent magnets of the rotational-permanent magnet device 70. The controller 200 has, for example, a translation controller 203, which is set up to control the translational movement of the carriage 10, and a rotation controller 206, which is set up to control the rotation of the bogie 30. The translation controller 203 and the rotation controller 206 may be implemented in a manner as indicated in this application, but are not limited thereto and may be implemented in any other suitable manner. Further, the controller 200 may include an overlay controller 209 connected to the translational controller 203 and the rotation controller 206 and configured to communicate corresponding control signals to the translational controller 203 and the rotation controller 206, in order to control the translational movement of the carriage 10 and the rotation of the bogie 30 in a superimposed manner (and thus to produce a superimposed movement of the translational movement and the rotation of the component 3).

In the present invention, the controller 200 is configured to activate at least one of the first and second translation-electromagnet devices 130, 140 such that the travel carriage 10 moves in a uniform or non-uniform translational manner, and/or at least one of the first and second rotational electromagnet devices 150, 160 such that the bogie 30 rotates in a uniform manner or in a non-uniform manner. As a result, the controller 200 is configured to generate a superimposed movement of translational movement and rotation of the component 3.

The controller 200 is configured, for example, to control the translational movement of the carriage 10 and the rotation of the bogie 30 in such a way that a constant rotational speed of component 3 is generated in a rotational direction at a varying translational speed of the component 3, or to control translational movement of the carriage 10 and the rotation of the bogie 30 in such a superimposed manner that a constant speed of translation of the component 3 is generated at a varying rotational speed of the component 3 in a rotational direction.

The travel carriage 10 according to the present invention also has a carriage-side longitudinal guide means 80, which is attached to the frame 20, and the travel carriage guide device 100 further has a guide device-side longitudinal guide means 180 complementary to the carriage-side longitudinal guide means 80, by means of which the carriage 10 is guided translationally. The carriage-side longitudinal guide means 80 and the guide device-side longitudinal guide means 180 may be formed in numerous ways, with examples according to the invention being described in more detail below with reference to FIGS. 5 to 16. However, the present invention is not limited to these examples. Furthermore, combinations of the examples described below are also possible in a device 1 according to the invention (e.g. a device 1 can have a combination from the example according to FIGS. 5 and 6 with the example according to FIGS. 7 and 8) (e.g. a carriage with rollers according to FIGS. 5 and 6 on only one side and rollers according to FIGS. 7 and 8 on the other side) or a combination from the example according to FIGS. 11 and 12 with the example according to FIGS. 13 and 14, whereby these combinations correspondingly are possible also with transverse fixed bearings and transverse floating bearings according to FIGS. 9 and 10 and FIGS. 15 and 16).

Figure 5:
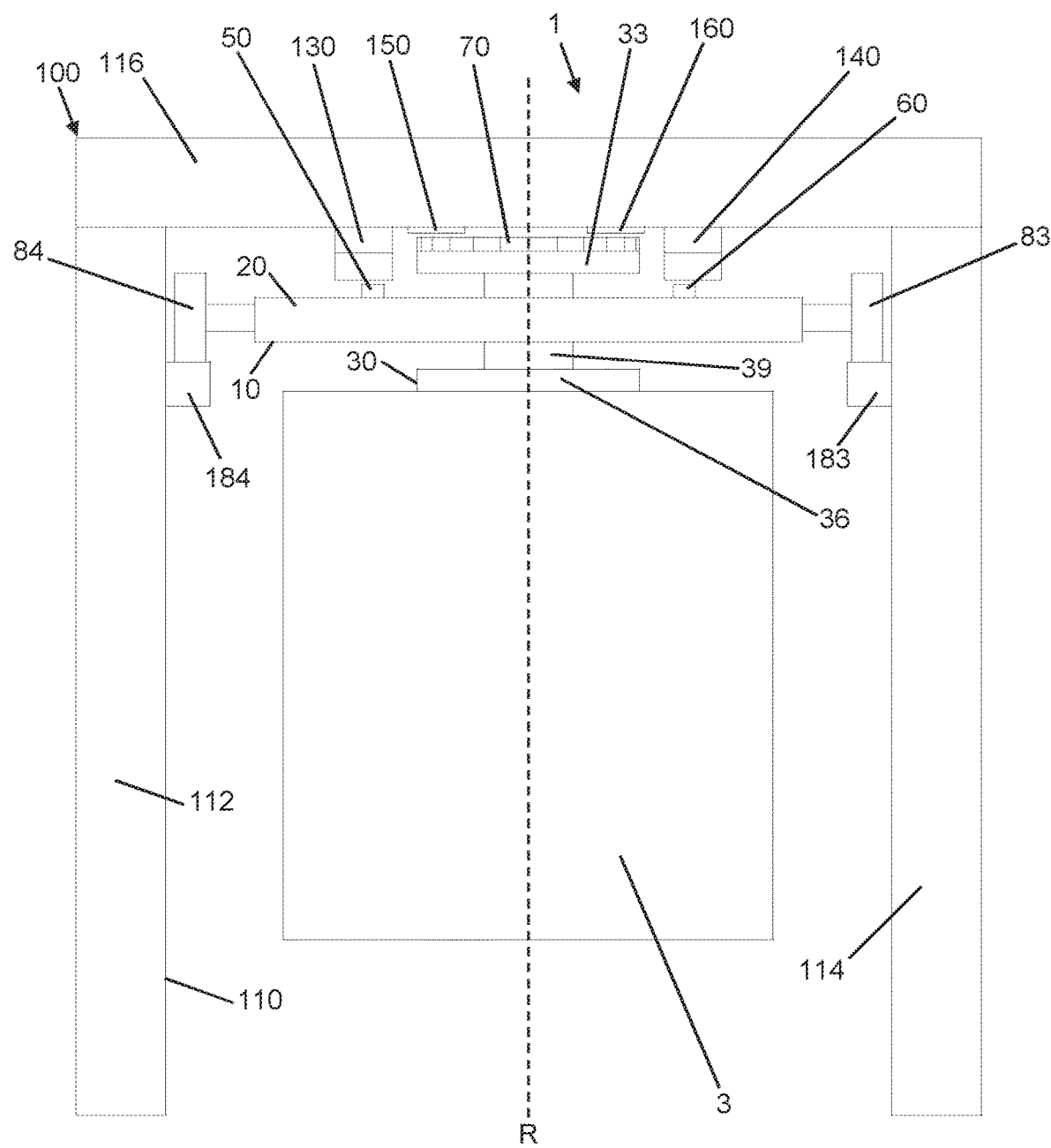
FIGS. 5, 7, 9, 11, 13, and 15 are respectively cross-sectional views of examples of carriage-side and guiding device-side longitudinal guide means of an exemplary apparatus for processing a component according to the present invention.
Figure 6:
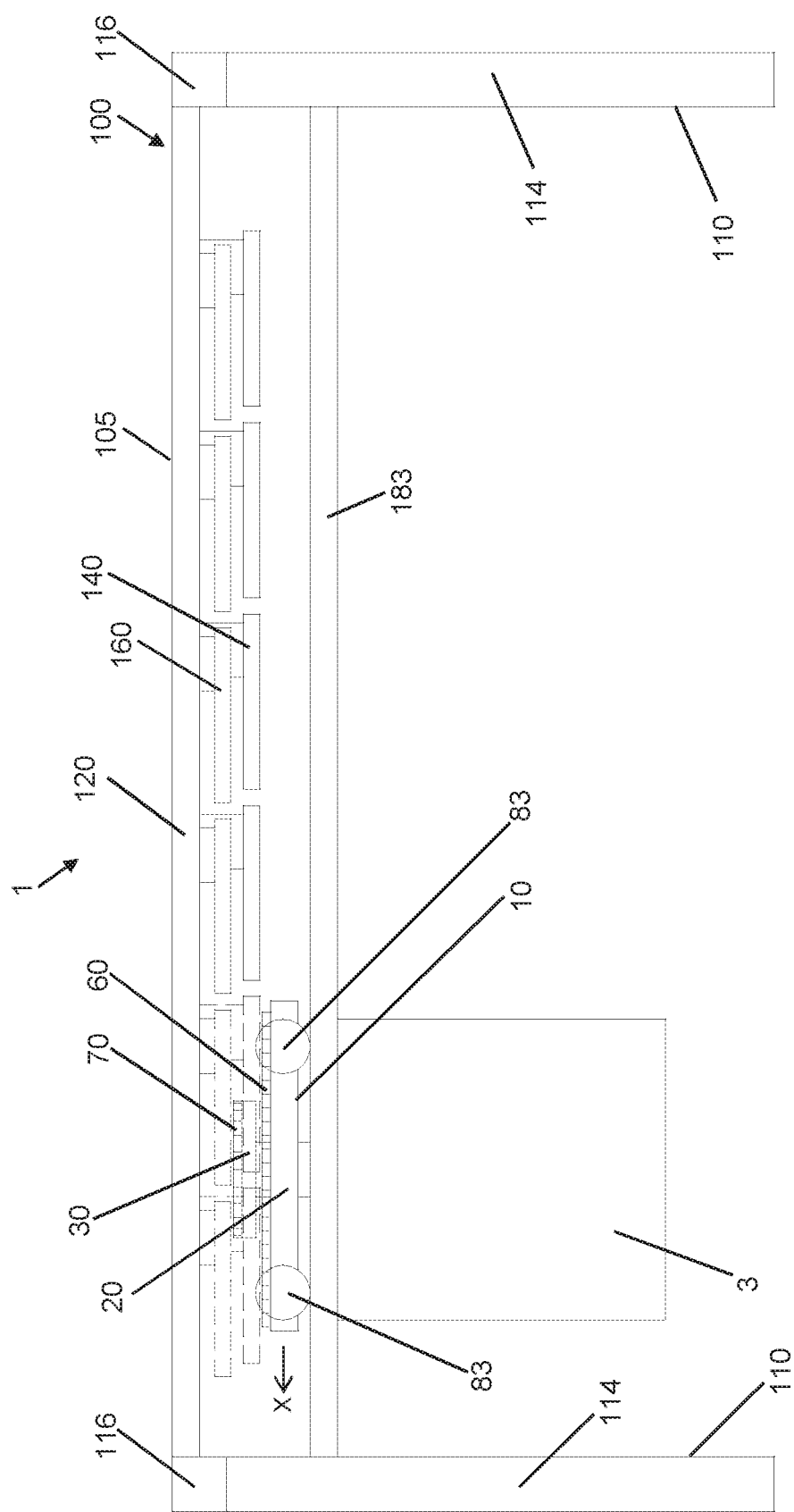
FIGS. 6, 8, 10, 12, 14 and 16 are respectively the cross-sectional views of FIGS. 5, 7, 9, 11, 13, and 15 associated side views of examples of carriage-side and guide device-side longitudinal guide means of an exemplary apparatus for processing a component according to the present invention.

In an example of the invention shown in FIGS. 5 and 6, the carriage-side longitudinal guide means 80 has a first carriage-side longitudinal guide means component in the form of first carriage-side rollers 83 and a second carriage-side longitudinal guide means component in the form of second carriage-side rollers 84, and the guide-side longitudinal guide means 180 has a first guide device-side longitudinal guide means component in the form of a first guide device-side longitudinal rail 183 and a second guide device-side longitudinal guide means component in the form of a second guide device-side longitudinal rail 184. The first guide device-side longitudinal rail 183 extends along the longitudinal direction X, and the second guide device-side longitudinal rail 184 is arranged opposite to (and spaced apart from) the first guide device-side longitudinal rail 183 with respect to the longitudinal direction X and also extends along the longitudinal direction X. The two longitudinal rails 183, 184 are further arranged, for example, below the cross members 116 and can connect the lateral brackets 110 together. The carriage-side rollers 83, 84 are rotatably connected to the frame 20 of the travel carriage 10, wherein, for example, the first carriage-side rollers 83 are arranged on a first side of the travel carriage 10 and are arranged in the longitudinal direction X at a distance from each other and wherein, for example, the second carriage-side rollers 84 are arranged on a second side opposite the first side of the travel carriage 10 relative to the longitudinal direction X, and are arranged in the longitudinal direction X at a distance from each other. Furthermore, the carriage-side rollers 83, 84 in FIGS. 5 and 6 can be designed as cylindrical rollers or plan rollers, for example, rollers with a spherical tread. In FIGS. 5 and 6, the first carriage-side rollers 83 are arranged above the first guide device-side longitudinal rail 183 and lie thereon, and the second carriage-side rollers 84 are arranged above the second guide device-side longitudinal rail 184 and lie thereon. Thereby, the weight of the travel carriage 10 and the component 3 is supported by the carriage-side rollers 83, 84 and the guide device-side longitudinal rails 183, 184 and the translational movement of the travel carriage 10 is conducted along the translation axis T through the carriage-side rollers 83, 84 and the guide device-side longitudinal rails 183, 184.

Figure 7:
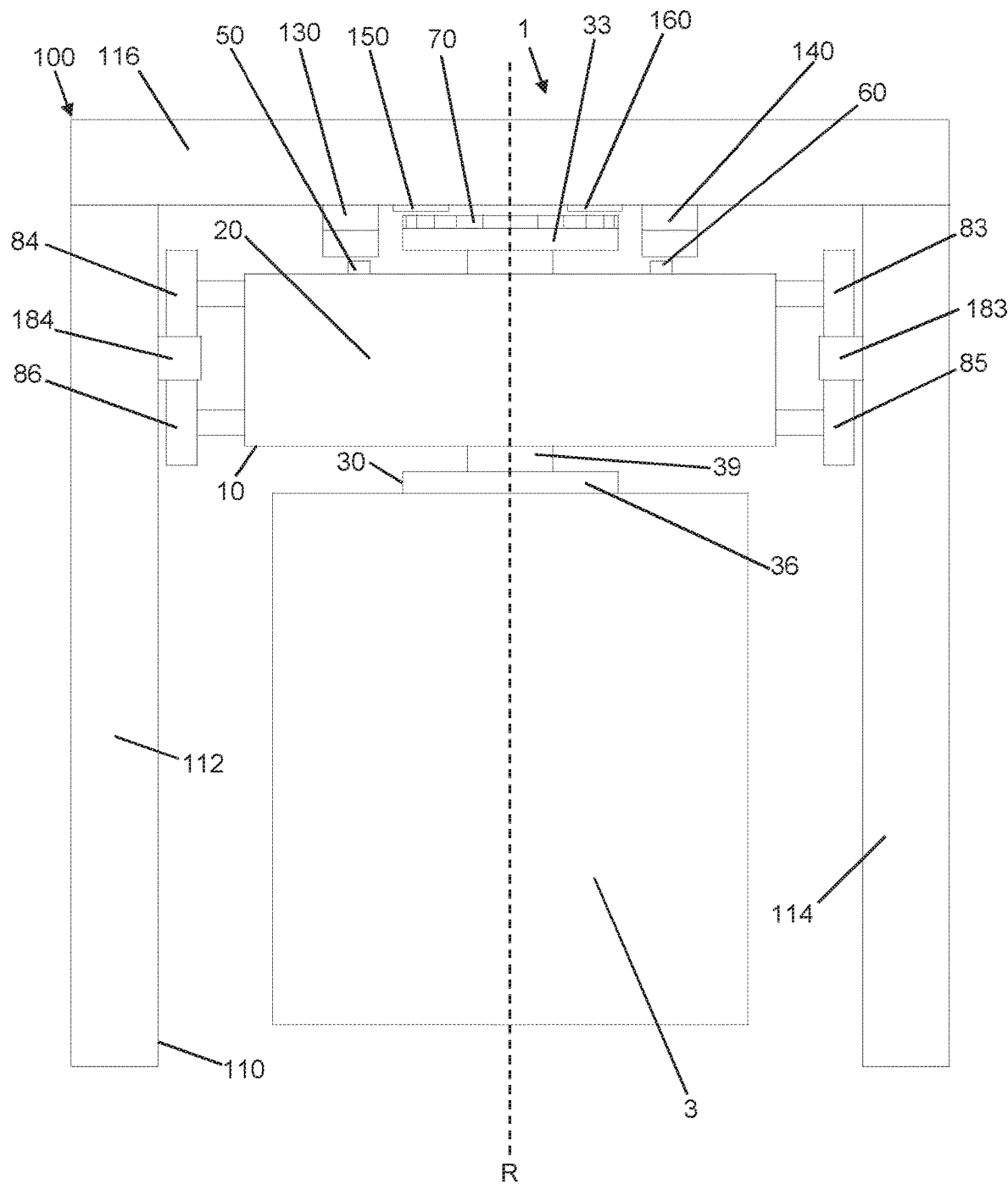
Figure 8:
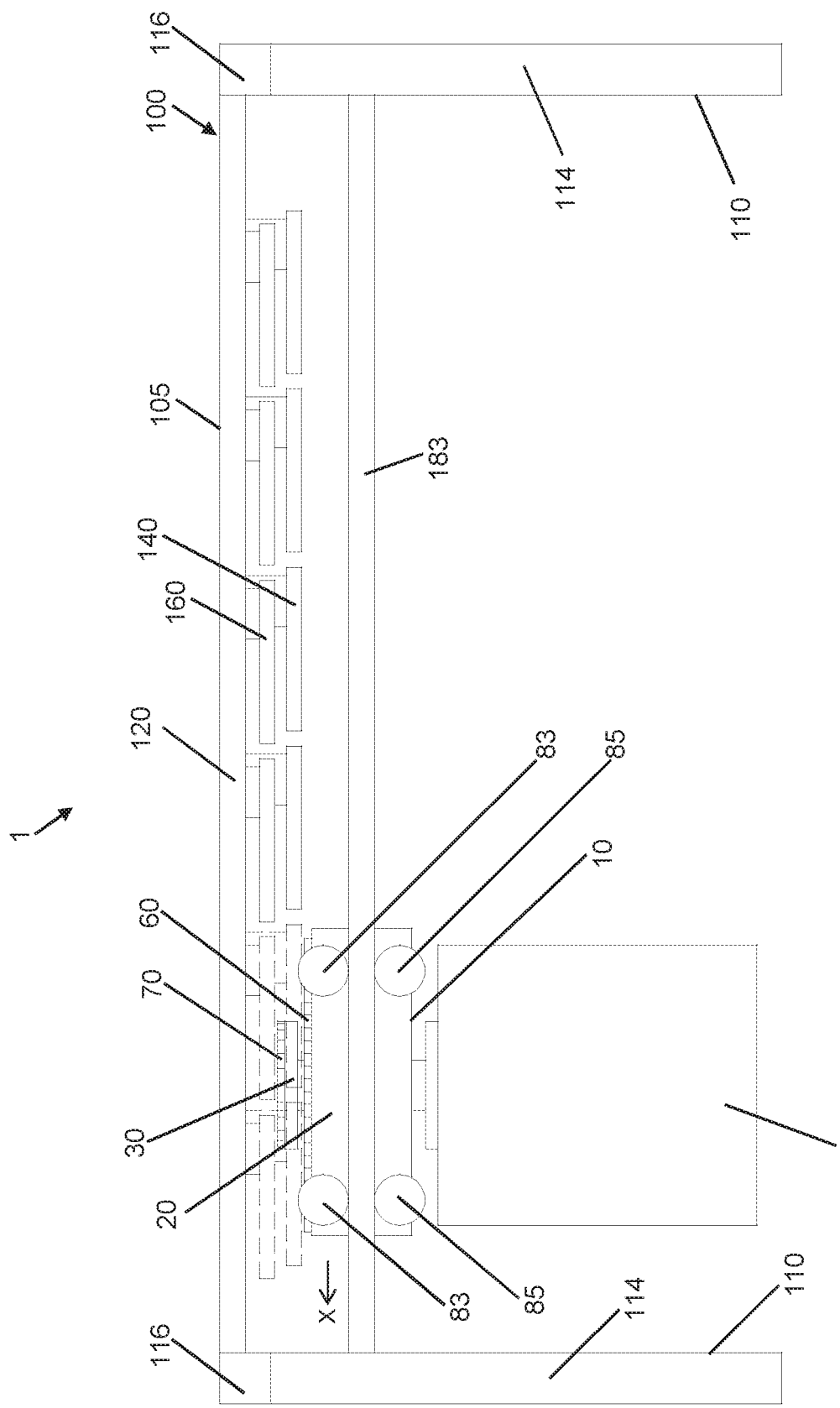

In a further example according to the invention according to FIGS. 7 and 8, the carriage-side longitudinal guide means 80 has in addition to the vehicle side rollers 83, 84 the rollers 85 and 86, which are rotatably connected to the frame 20 of the travel carriage 10 and can be formed as cylindrical rollers or plan rollers, for example, rollers with spherical tread. Thus, in this example, the first carriage-side longitudinal guide component 83 is formed by the first carriage-side rollers 83, 85 opposed to the first guide-side longitudinal rail 183, and the second carriage-side longitudinal guide component 83 is formed by the second carriage-side rollers 84, 86 opposite to the second guide-side longitudinal rail 184. In FIGS. 7 and 8, the first carriage-side rollers 83, 85 are arranged on both sides (e.g., above and below) of the first guide device-side longitudinal rail 183, and the second carriage-side rollers 84, 86 are arranged on both sides (e.g., above and below) the second guide device-side longitudinal rail 184. Thus, the first carriage-side rollers 83, 85 may form first carriage-side roller pairs, and the second carriage-side rollers 84, 86 may form second carriage-side roller pairs. Thereby, the travel carriage 10, in addition to supporting the weight of the travel carriage 10 and the component 3, as well as guiding the translational movement of the travel carriage 10 by means of carriage-side rollers 83 84, can be supported and guided against the magnetic attraction forces, which act on the one hand between the respective permanent magnet devices and the respective electromagnetic devices, by means of the carriage-side rollers 85, 86, at the guide device-side rails 183 and 184, whereby, for example, a substantially constant gap between the respective electromagnetic devices and the respective permanent magnet devices can be maintained.

Figure 9:
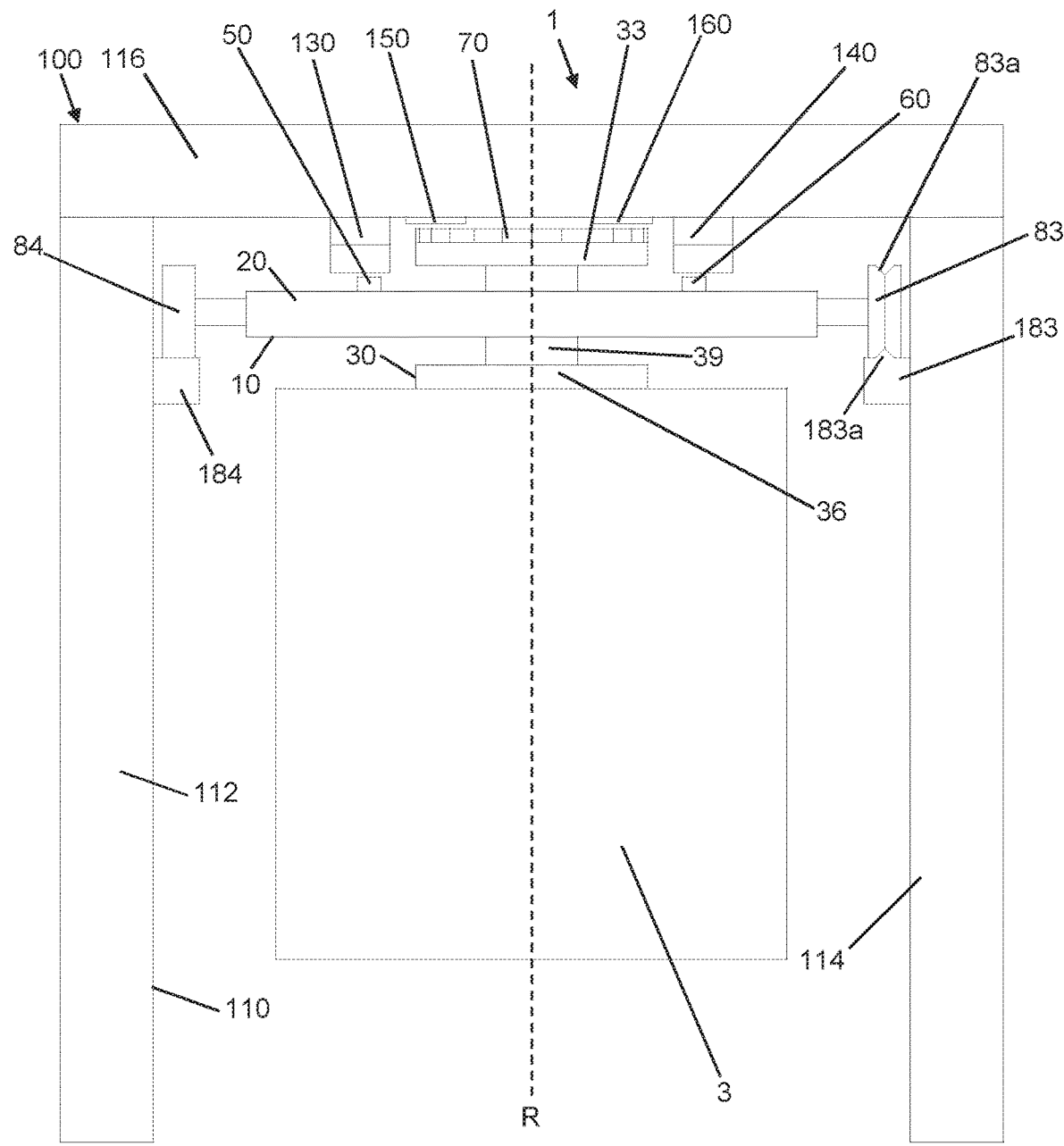
Figure 10:
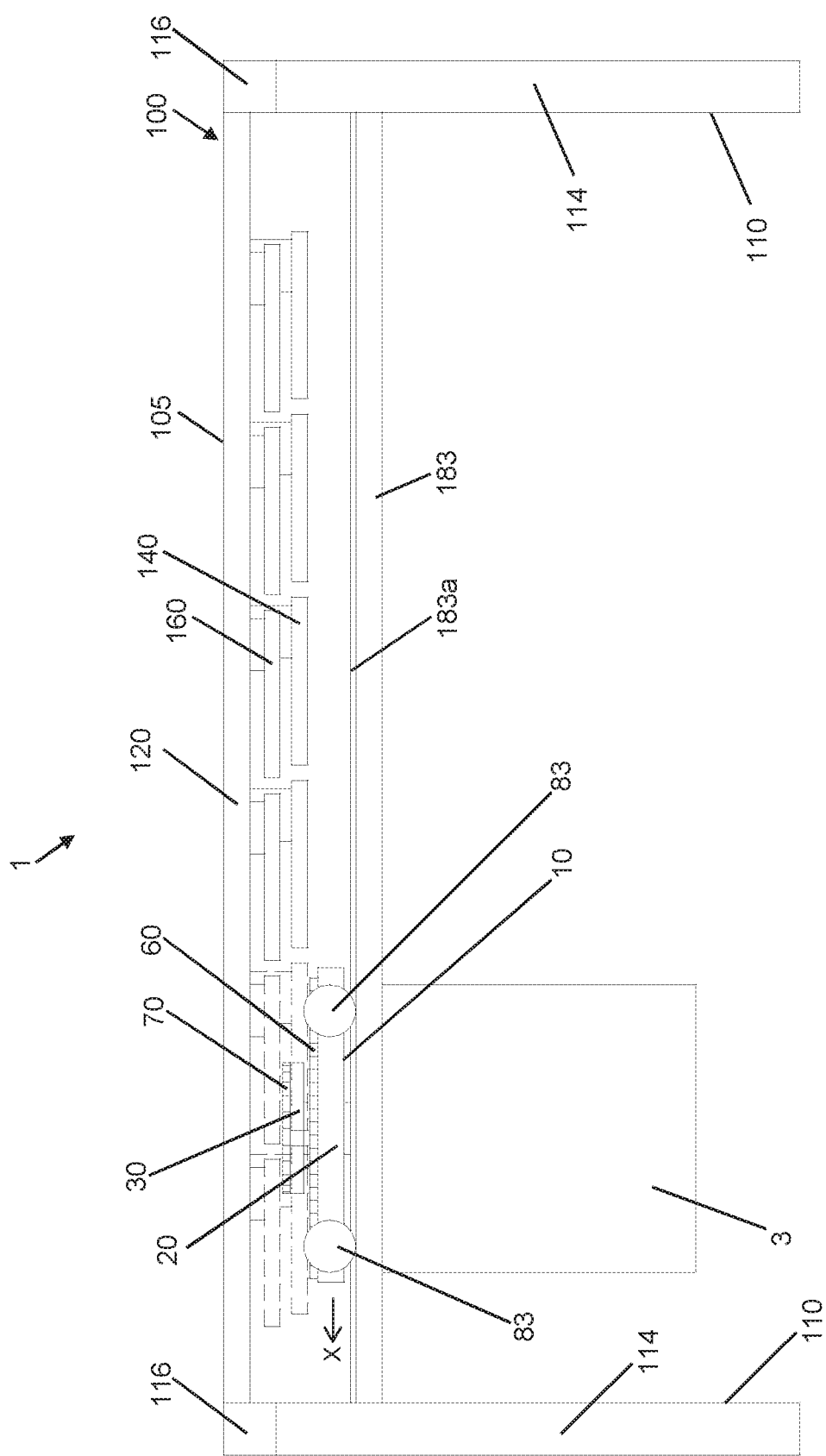

In the example according to the invention according to FIGS. 9 and 10, it is additionally provided in comparison with the example according to FIGS. 5 and 6 that the first carriage-side rollers 83 engage with the first guide device-side longitudinal rail 183 while forming a transverse fixed bearing in a concave-convex engagement that prevents cross-play (e.g., by cooperation of a concave tread profile 83a of the rollers 83 with a convex outer portion 183a of the longitudinal rail 183) and the second carriage-side rollers 84 engage with the second guide device-side longitudinal rail 184 while forming a transverse floating bearing in an engagement that permits cross-play (e.g., by cooperation of a spherical tread profile of the rollers 84 with a flat surface of the longitudinal rail 184). The structure with transverse fixed bearing and transverse floating bearing, as in the example of FIG. 9 and FIG. 10, can be applied in a corresponding manner to the example of FIG. 7 and FIG. 8, in which case the first carriage-side rollers 83, 85 (or the first carriage side roller pairs) engage with the first guide device-side longitudinal rail 183 to form a transverse fixed bearing in a concave-convex engagement that prevents cross-play and the second carriage-side rollers 84, 86 (or the second carriage side roller pairs) engage with the second guide-side longitudinal rail 184 while forming a transverse floating bearing in an engagement that permits cross-play. In this way, the transverse fixed bearing additionally ensures even safer and more precise guidance of the travel carriage 10 in the translational movement of the travel carriage 10, wherein the transverse floating bearing can additionally compensate transverse movements (e.g. temperature-induced transverse deformations) of the travel carriage 10.

Although in FIGS. 5, 6, 9 and 10, only two first carriage-side rollers 83 and in FIG. 7 and FIG. 8 only two first carriage side roller pairs of rollers 83, 85 are shown by way of example, the present invention is not limited thereto and any number of carriage-side rollers or carriage-side roller pairs may be provided on the carriage 10. Each module 105 may further include the guide device-side longitudinal rails 183 and 184, and the guide device-side longitudinal rails 183 and 184 of the individual modules 105 may further be arranged immediately one after the other (e.g., substantially without gaps) as shown in FIG. 3. However, it may also be that individual modules 105 have no guide device-side longitudinal rails 183 and 184 and/or the guide device-side longitudinal rails 183 and 184 are interrupted (e.g. along the longitudinal direction X there are spaces or gaps between guide device-side longitudinal rails present). In such a case, an appropriate number of first carriage-side rollers or first carriage-side roller pairs and second carriage-side rollers or second carriage-side roller pairs may be provided on the travel carriage 10 over a suitable distance along the longitudinal direction X, so that the travel carriage 10 can bridge the corresponding gap between the guide device-side longitudinal rails 183 and 184.

Figure 11:
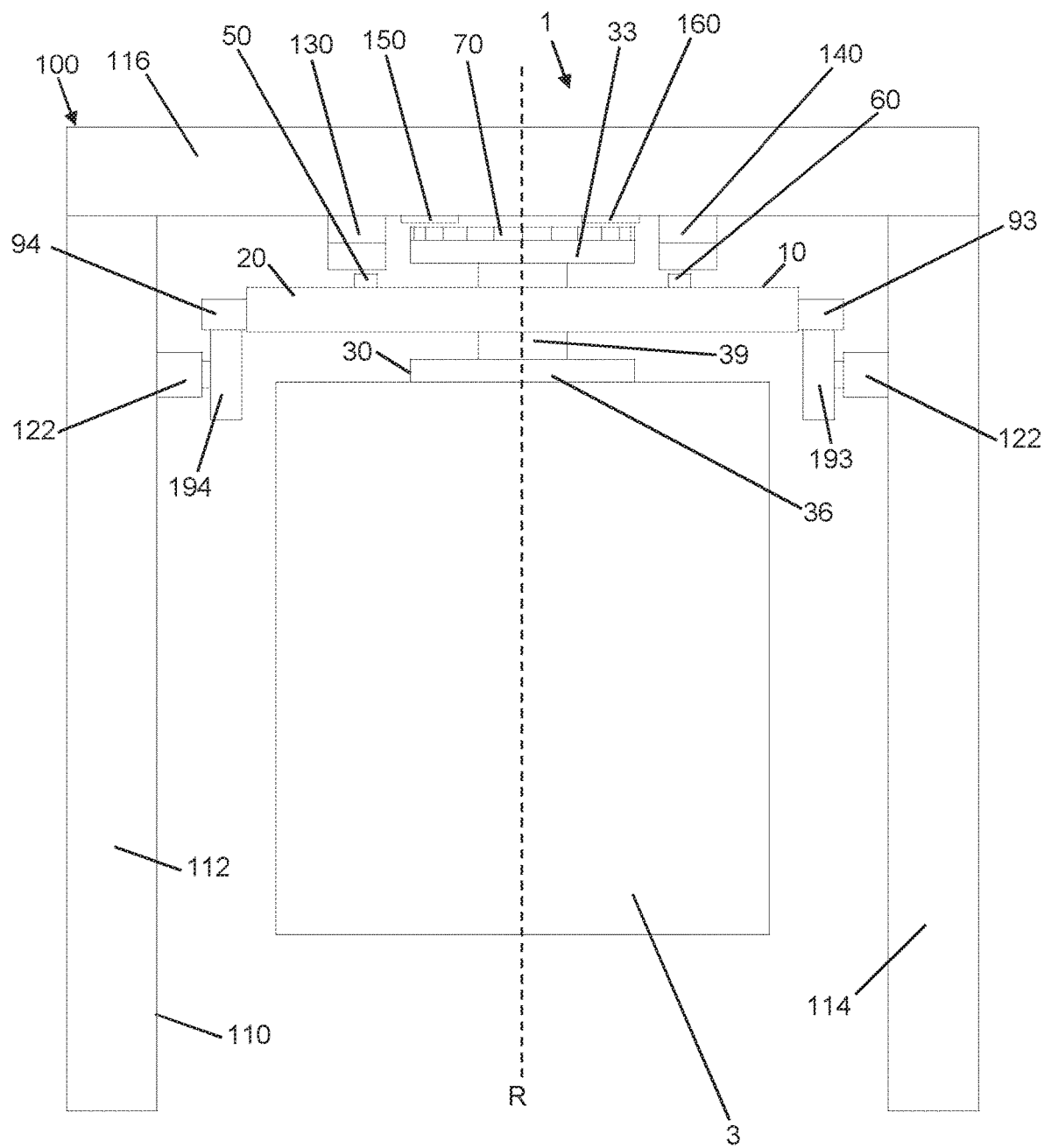
Figure 12:
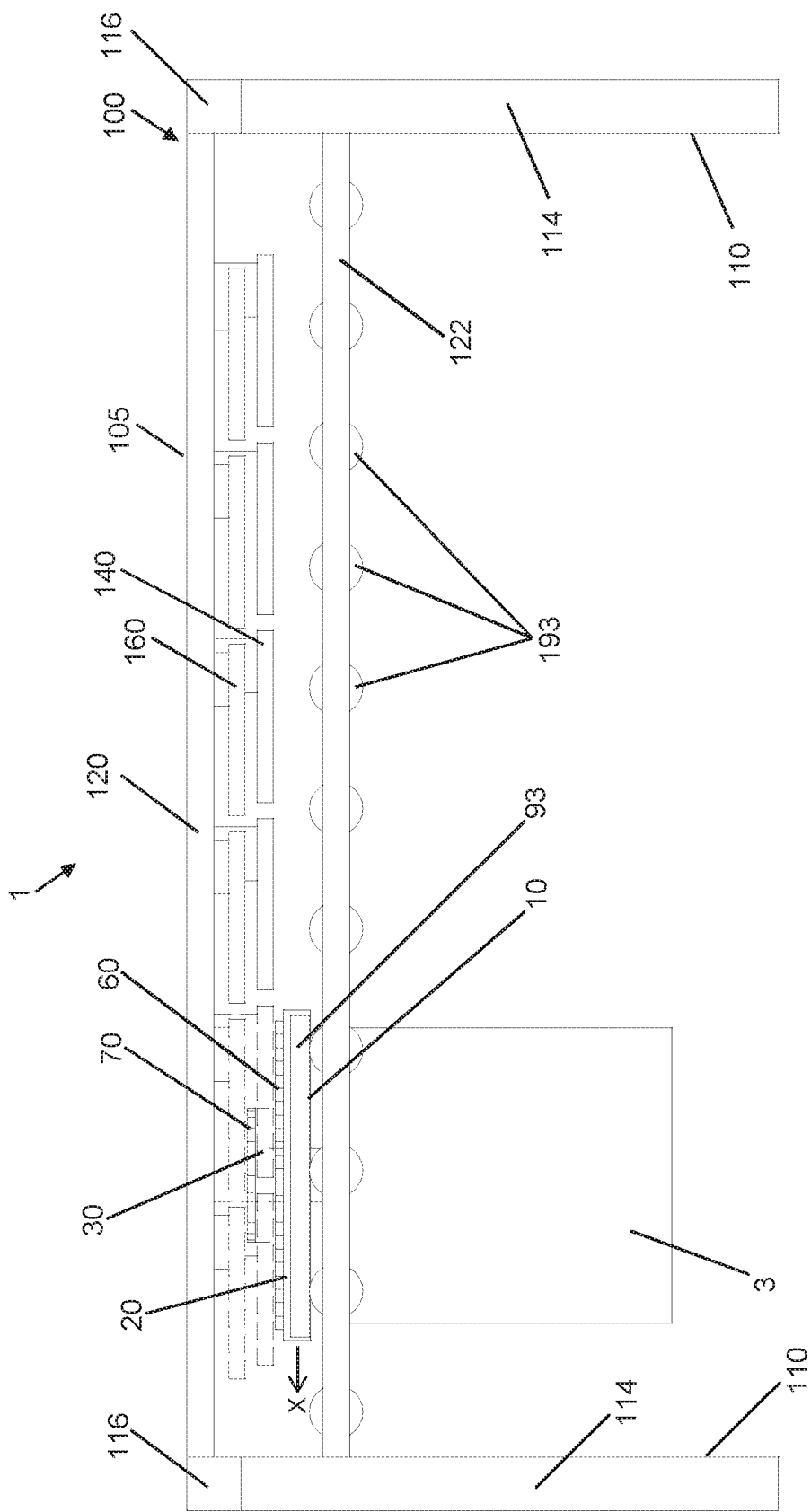

FIG. 11 and FIG. 12 show an example of the invention, wherein the carriage-side longitudinal guide means 80 comprises a first carriage-side longitudinal guide means component in the form of a first vehicle-side longitudinal rail 93 and a second carriage-side longitudinal guide means component in the form of a second vehicle-side longitudinal rail 94 and the guide device-side longitudinal guide means 180, has a first guide device-side longitudinal guide device component in the form of first guide device-side rollers 193 and a second guide device-side longitudinal guide means component in the form of second guide device-side rollers 194. The first carriage-side longitudinal rail 93 is attached to one side of the travel carriage 10 and extends along the longitudinal direction X, and the second carriage-side longitudinal rail 94 is attached to the opposite (and for example at a distance to) side of the travel carriage 10 with respect to the longitudinal direction X. The guide device-side rollers 193, 194 are rotatably connected to the travel carriage guide device 100 (e.g., by a first cross rail 122), wherein, for example, the first guide device-side rollers 193 are arranged on a first side of the travel carriage guide device 100, and are arranged in the longitudinal direction X at a distance from each other and wherein, for example, the second guide device-side rollers 194 are arranged with respect to the longitudinal direction X opposite the first side on a second side of the travel carriage guide device 100, and are arranged in the longitudinal direction X at a distance from each other. Further, the guide device-side rollers 193, 194 in FIGS. 11 and 12 may be formed as cylindrical rollers or plan rollers, such as rollers having a spherical tread. In FIGS. 11 and 12, the first carriage-side longitudinal rail 93 rests on the first guide device-side rollers 193, and the second carriage-side longitudinal rail 94 rests on the second guide device-side rollers 194. In this way, the weight of the travel carriage 10 and the component 3 is supported by the guide device-side rollers 193, 194 and the carriage-side longitudinal rails 93, 94 and the translational movement of the travel carriage 10 along the translation axis T is guided by the guide device-side rollers 193, 194 and the carriage-side longitudinal rails 93, 94.

Figure 13:
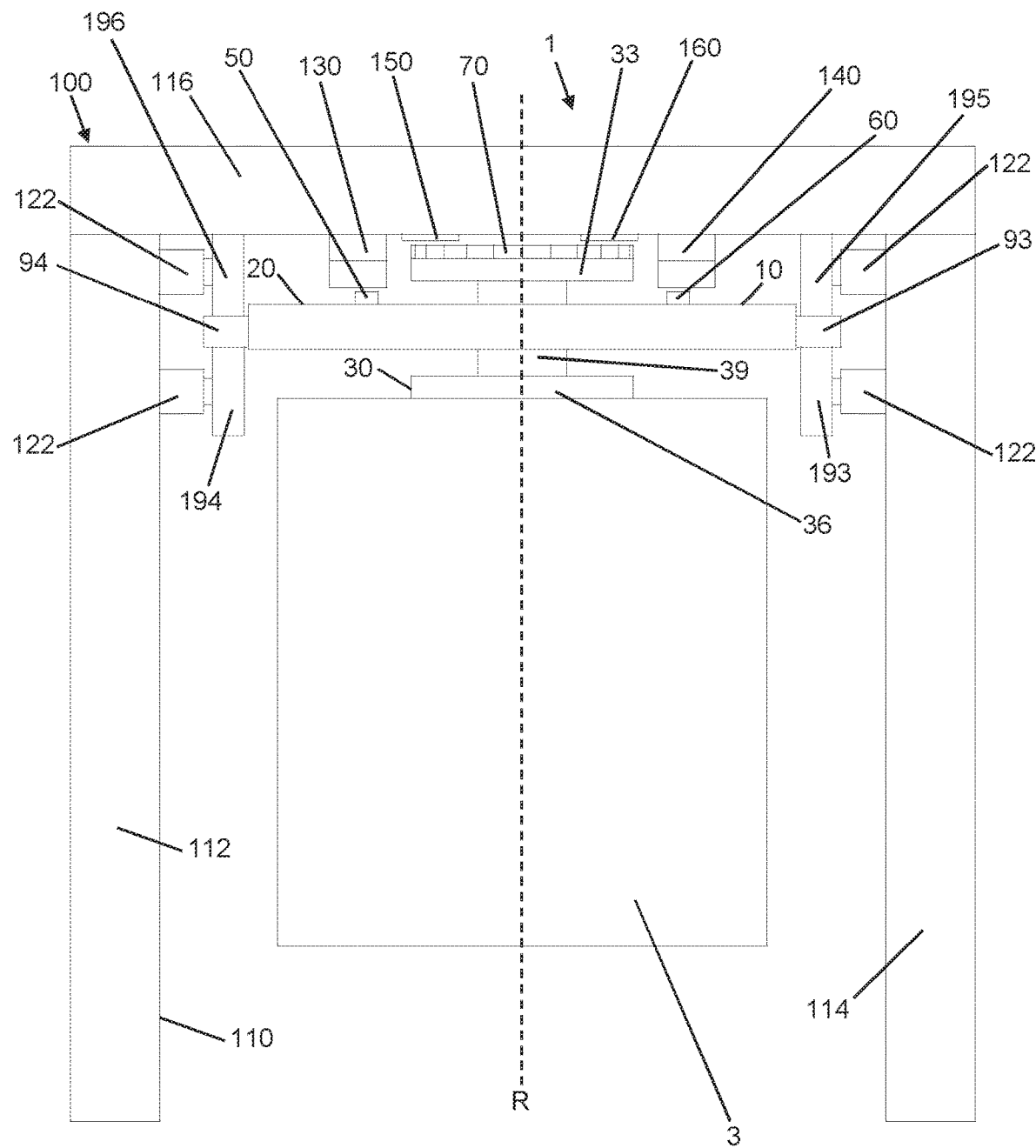
Figure 14:
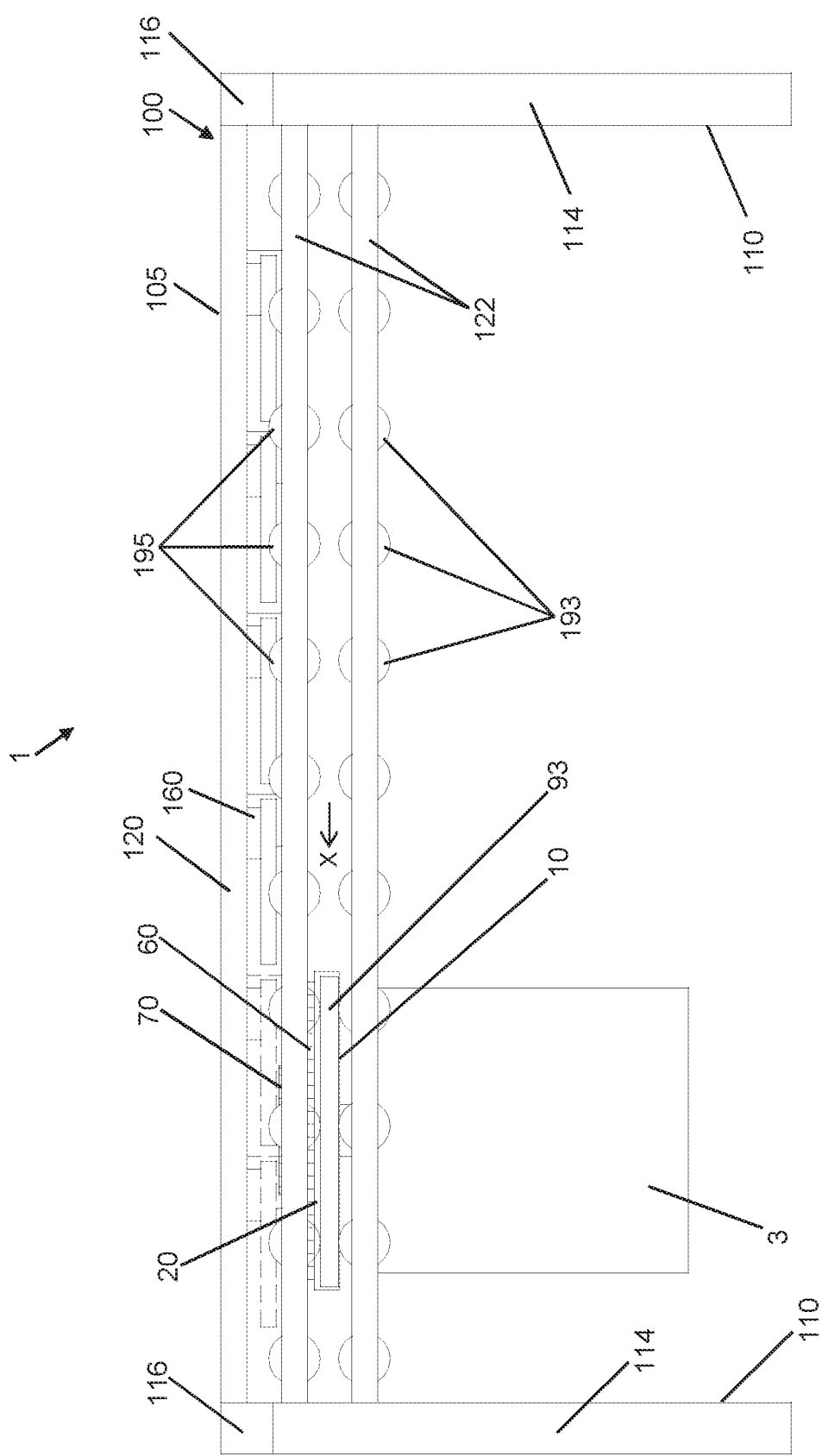

In the example of the invention shown in FIGS. 13 and 14, in addition to the guide device-side rollers 193, 194, the guide device-side longitudinal guide means 180 also has the guide device-side rollers 195, 196 which are rotatably connected to the travel carriage guide device 100 (e.g., with a second transverse longitudinal rail 124) and which can be designed as cylindrical rollers or plan rollers, for example rollers with spherical tread. Thus, in this example, the first guide device-side longitudinal guide means component is formed by the first carriage-side rollers 193, 195 opposed to the first carriage-side longitudinal rail 93, and the second guide device-side longitudinal guide means component is formed by the second guide device-side rollers 194, 196 opposed to the second guide device-side longitudinal rail 94. For example, in FIGS. 13 and 14, the first guide device-side rollers 193, 195 are arranged on both sides (e.g., above and below) of the first carriage-side longitudinal rail 93 and the second guide device-side rollers 194, 196 are arranged on both sides (e.g., above and below) of the second carriage-side longitudinal rail 94. Specifically, the first guide device-side rollers 193, 195 may form first guide device-side roller pairs, and the second guide device-side rollers 194, 196 may form second guide device-side roller pairs. Thereby, the travel carriage 10, in addition to supporting the weight of the travel carriage 10 and the component 3, as well as guiding the translational movement of the travel carriage 10 by means of guide device-side rollers 193 and 194, can be supported and guided against the magnetic attraction forces, which act on the one hand between the respective permanent magnet device and the respective electromagnet devices, by means of the carriage-side longitudinal rails 93 and 94 by means of the guide device-side rollers 195 and 196, whereby, for example, a substantially constant gap can be maintained between the respective electromagnet device and the respective permanent magnet device.

Figure 15:
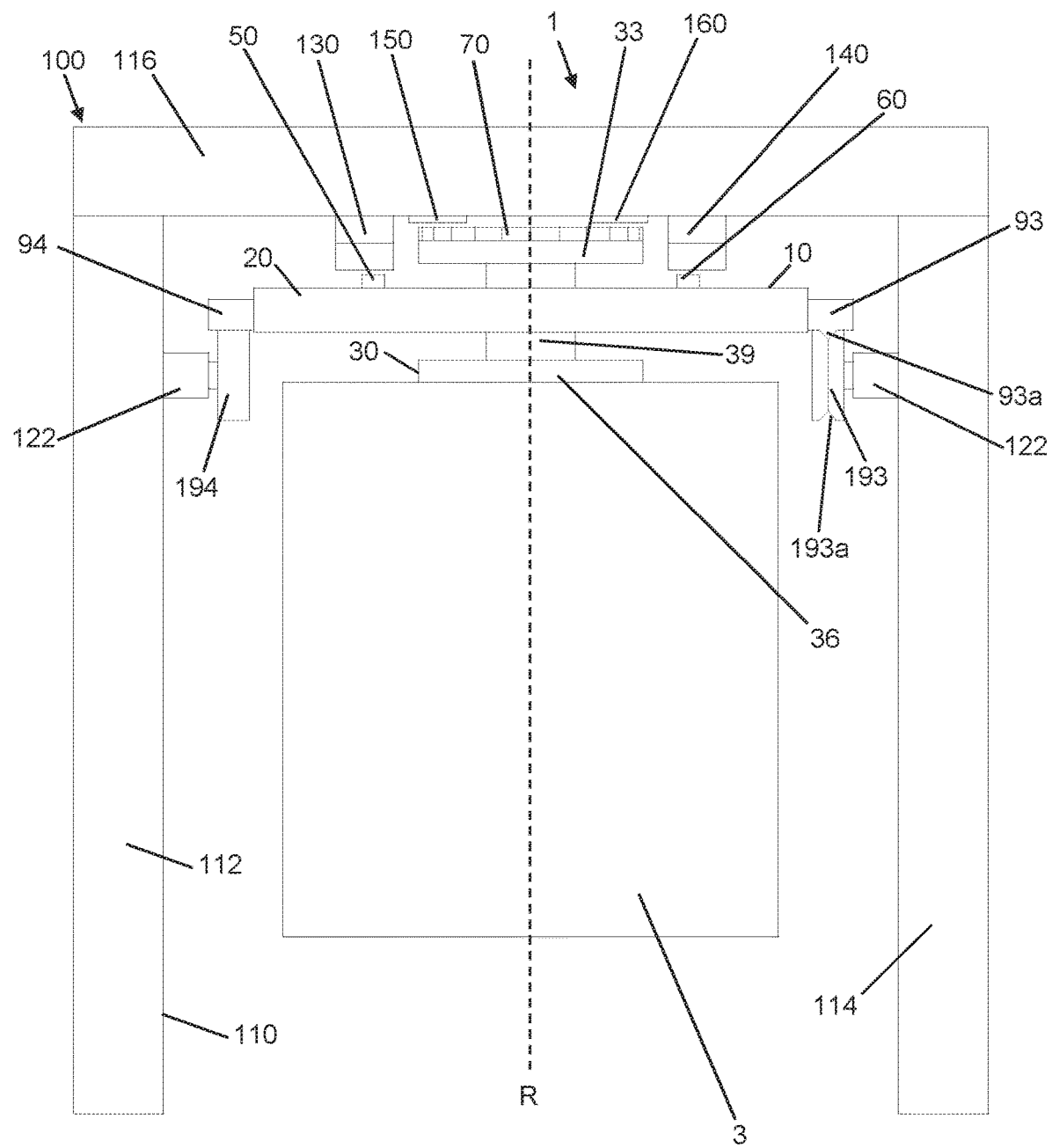
Figure 16:
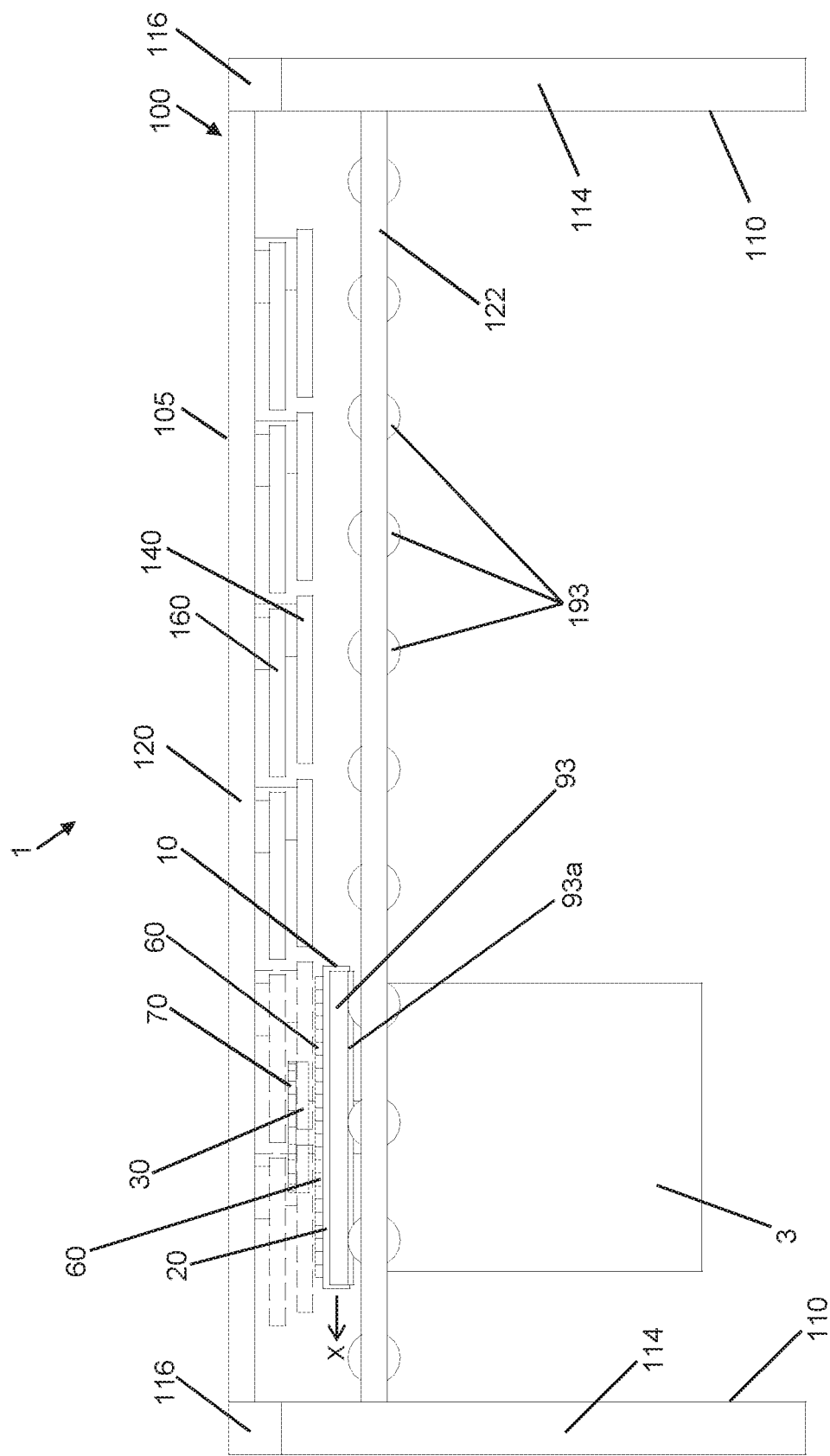

In an example according to the invention according to FIGS. 15 and 16, in comparison with the example according to FIGS. 11 and 12, it is additionally provided that the first guide device-side rollers 193 are connected to the first carriage-side longitudinal rail 93 (e.g. by cooperation of a concave tread profile 193a of the rollers 193 having a convex outer portion 93a of the longitudinal rail 93) to form a transverse fixed bearing in transverse concave-convex engagement and the second guide device-side rollers 194 are connected to the second carriage-side longitudinal rail 94 (e.g., by cooperation of a spherical tread pattern of the rollers 194 with a flat surface of the longitudinal rail 94) to form a transverse floating bearing in a cross-play permitting engagement. The structure with transverse fixed bearing and transverse floating bearing, as in the example of FIG. 15 and FIG. 16, can be applied in a corresponding manner to the example of FIG. 13 and FIG. 14. In the corresponding application to the example of FIGS. 13 and 14, the first guide device-side rollers 193, 195 (or the first guide device-side roller pairs) are then connected to the first carriage-side longitudinal rail 93 to form a transverse fixed bearing in concave-convex engagement that prevents cross-play and the second guide device-side rollers 194, 196 (or the second guide device-side roller pairs) is connected to the second carriage-side longitudinal rail 94 to form a transverse floating bearing in a cross-play permitting engagement. In this way, in addition, the transverse fixed bearing can ensure an even safer and more precise guidance of the travel carriage 10 in the translational movement of the travel carriage 10 and the transverse floating bearing can also compensate for transverse movements (e.g. temperature-induced transverse deformations) of the carriage 10.

The device 1 may further comprise at least one translation measuring device for non-contact measurement of the translational movement of the travel carriage 10 and at least one rotation measuring device for non-contact measurement of the rotation of the bogie 30.

In an example according to the invention, the device 1 may comprise a first translation measuring device 220 for non-contact measuring of the translational movement of the travel carriage 10, a second translation measuring device 230 for contactless measuring of the translational movement of the travel carriage 10 and a rotation measuring device 240 for non-contact measuring of the rotation of the bogie 30, each of which are respectively connected to the controller 200. By using a first and a second translation measuring device for measuring the translational movement, the failure and reliability of the system is increased due to the redundancy. However, the present invention is not limited in terms of the measuring devices, and further translation measuring devices and also other rotation measuring devices may be provided.

For example, the first translation measuring device 220 is configured to magnetically detect the translation path and translation direction of the travel carriage 10, and the translation measuring device 230 is configured, for example, to optically capture the translational path and translation direction of the travel carriage 10. For this purpose, the first translation measuring device 220 is designed, for example, as a magnetic (e.g., a magnetostriction-based) translation detection device which has at least one (permanent) magnetic position sensor mounted laterally on the travel carriage 10 (e.g. fixed) and at least one magnetic sensor mounted on the travel carriage guide device 100 (e.g. at the posts 112 and/or 114 of the lateral bracket 100) (e.g. fixed), which cooperates magnetically with the magnetic position sensor to determine the translation path and the translation direction of the travel carriage 10. Further, the second translation measuring device 230 is configured, for example, as an optical translation detection device having at least one (e.g., fixed) scale attached (e.g., a glass scale, a stainless steel scale), which has bars and gaps between the bars and at least one optical pickup head mounted on the travel carriage guide device 100 (e.g., at the posts 112 and/or 114 of the lateral brackets 100) (e.g., fixed) configured to scan the scale (e.g., the bars and gaps of the scale), to determine the translation path and the translation direction of the travel carriage 10. However, the first and second translation measuring devices 220 and 230 are not limited to these exemplary embodiments and may be implemented in other ways as long as they are suitable for measuring the translation of the travel carriage 10.

The rotation-measuring device 240 may be configured according to the present invention to detect the angle (or the rotational path) and/or the rotation speed and/or the direction of rotation of the bogie 30 in an optical way by means of a stationary sensor device such as shown in FIG. 17 to FIG. 20. (the translation and the rotation-electromagnet devices are not shown in these figures for reasons of clarity and also partially the translation- and the rotation-permanent magnet devices are not shown).

Figure 17:
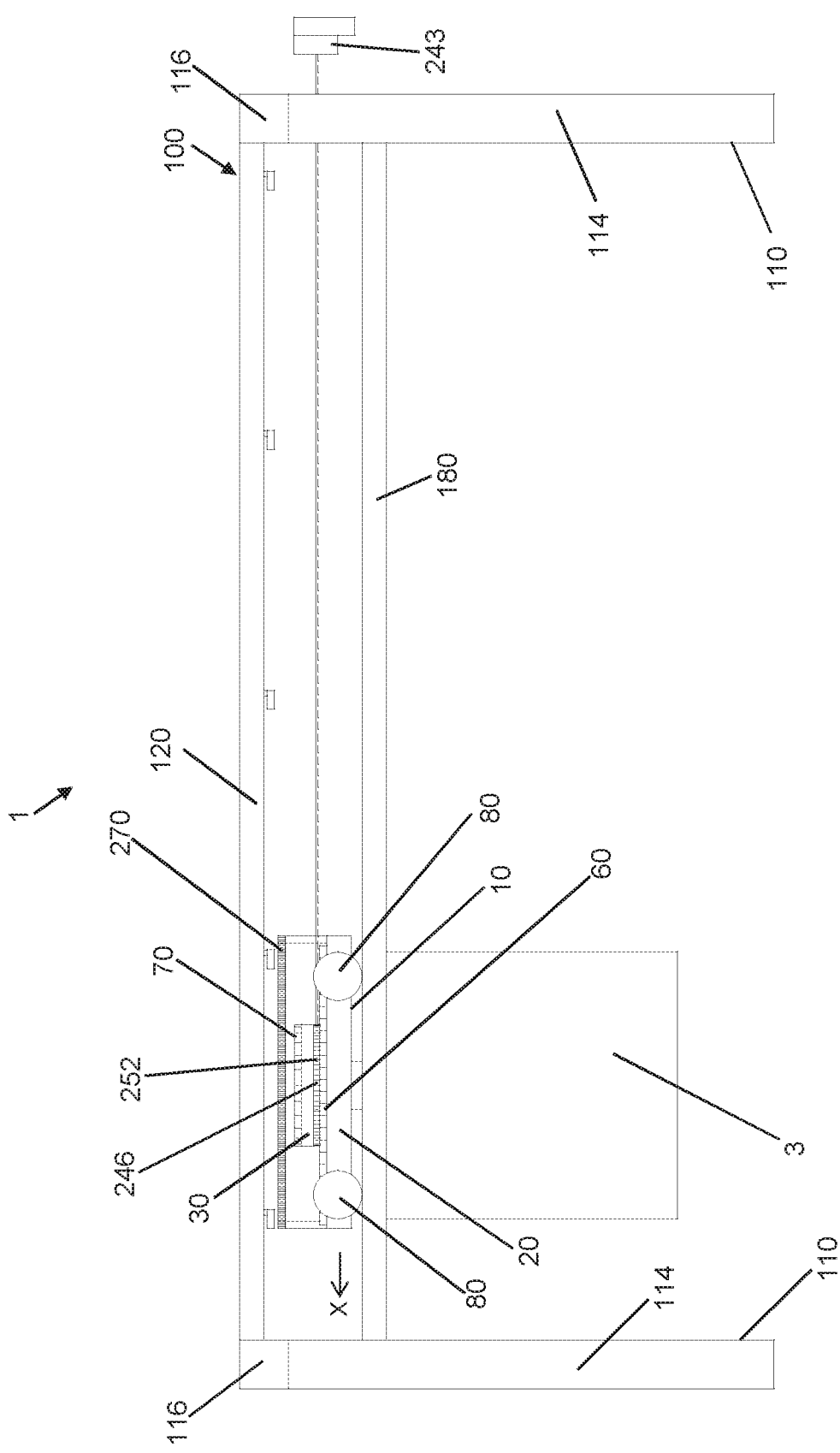
FIGS. 17 to 20 are examples of a rotation-measuring device for an exemplary apparatus for processing a component according to the present invention.
Figure 18:
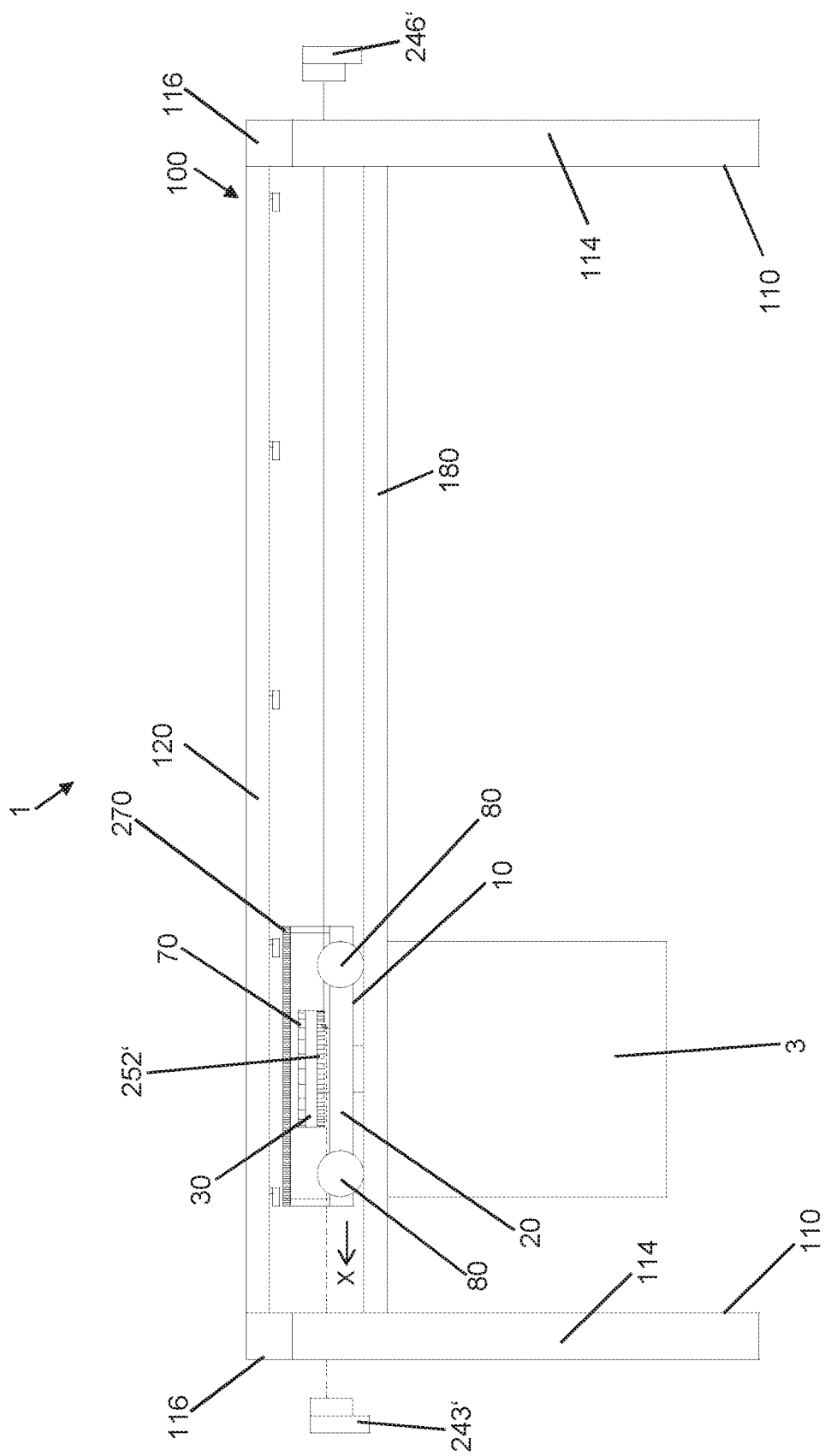
Figure 19:
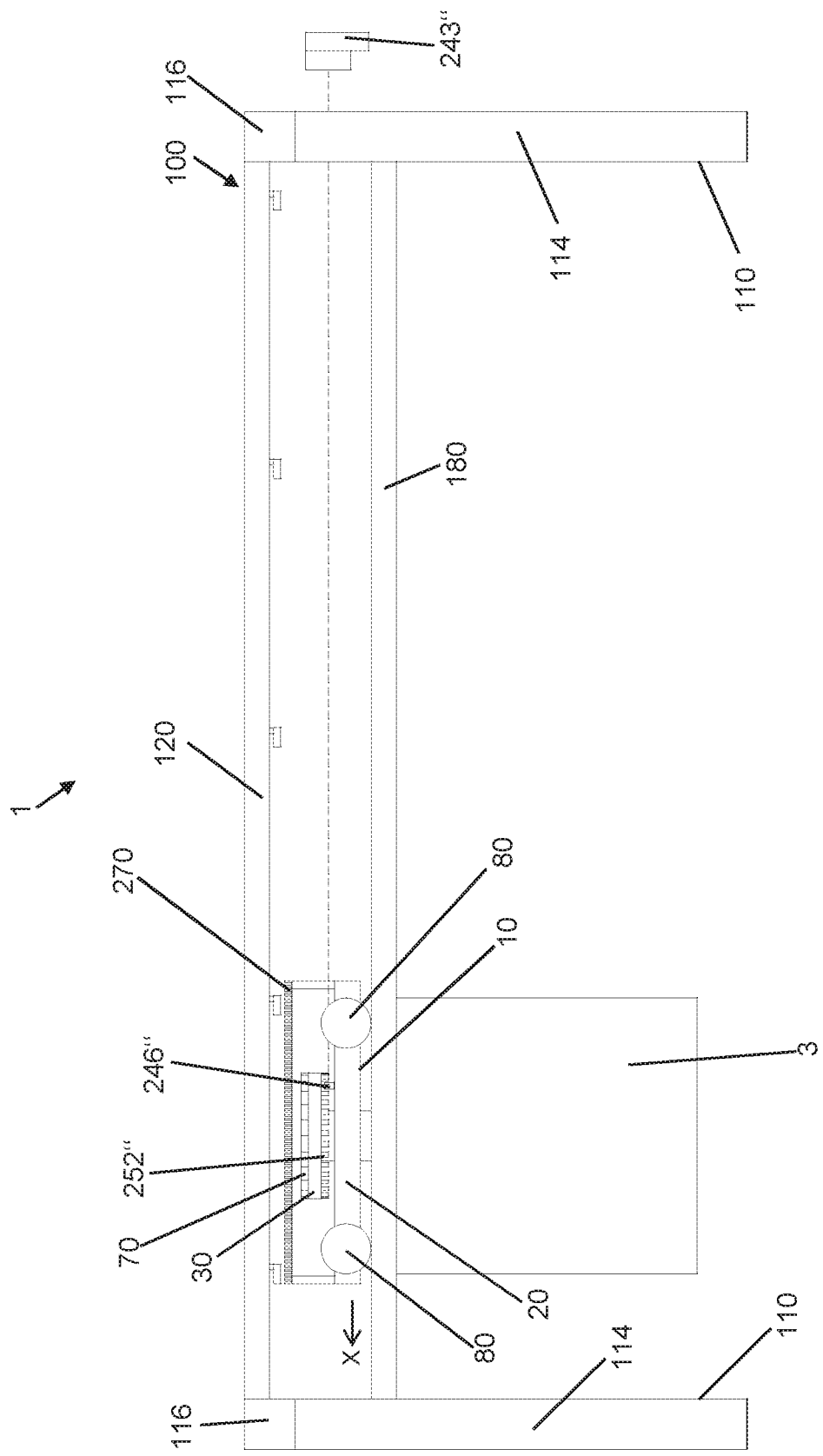

For this purpose, the rotation-measuring device 240 can, for example, have an optical incremental measuring device (or incremental sensor) or an optical measuring device having an absolute value or be formed as such. Referring to FIGS. 17 to 19, various examples of an optical rotation measuring device 240 will be described, but the present invention is not limited to these examples.

In the example according to FIG. 17, the rotation measuring device 240 has a stationary sensor device 243 (for example with respect to the carriage 10) and a reflecting device 246. The stationary sensor device 243 is set up to emit at least one (e.g. at least two or exactly two) light beam(s) (e.g. at least one laser beam, for example at least or exactly two laser beams) in the direction of the travel carriage 10 (depicted in FIG. 17 using the continuous solid line coming from the sensor device 243), to receive at least one light beam pulsedly reflected from the reflecting device 246 (e.g. at least or exactly two pulsedly reflected light beams) and to determine, using the at least one pulsedly reflected light beam, the angle (or the rotation path) and/or the rotational speed and/or the direction of rotation of the bogie 30. For example, the stationary sensor device 243 has at least one reflected light barrier, for example at least or exactly two reflected light barriers, which is set up to emit a respective light beam and to receive the respective light beam in the form of a reflected light beam. The reflecting device 246 is mounted on the bogie 30 (e.g., on the first wheel of the bogie 30) and is adapted to reflect at least one incident light beam in pulses as the bogie 30 rotates (shown in FIG. 17 using a dashed line running to the sensor device 243). For this purpose, the reflecting device 246 has, for example, attached to the frame 20 of the travel carriage 10 (not fixed) is a mirror (not shown) to which the at least one light beam of the stationary sensor device 243 is directed, and an encoder 252 extending along the circumferential direction U and rotatably connected to the bogie 30 (as shown in FIG. 3), the encoder being arranged between the mirror and the stationary sensor device 243 and having a plurality of slots (e.g. in the form of one or more (e.g. staggered) series of coding slots, for example, preferably in shape of two mutually offset series of coding slots), whereby the reflecting device 246 is adapted to pulsedly reflect, through the plurality of slots, upon rotation of the bogie 30, at least one incidental light beam which hits the reflecting device 246, the reflection being according to the direction of rotation and/or the angle (or rotation) and/or the rotational speed. For example, to measure the rotational direction-independent angle and/or the rotational direction-independent rotational speed of the bogie 30, a (e.g., a single) light beam emitted from the stationary sensor device 243 (and then reflected by the reflecting device 246) and a (e.g., a single) row of coding slots may be used to generate light pulses. For example, two light beams emitted by the stationary sensor device 243 (and then reflected by the reflecting device 246) and two mutually offset coding slot rows can be used for generating light pulses for a respective light beam for the purposes of measuring the rotation direction-dependent angle and/or the rotation direction-dependent rotation speed (or only the rotation direction).

The rotation-measuring device 240 according to the inventive example of FIG. 18 has a (for example with respect to the travel carriage 10) stationary sensor device 243', a stationary light radiating device 246' opposite the stationary sensor device 243' (for example, with respect to the travel carriage 10) and an encoder 252' (similar to the one in FIG. 3) rotatably connected to the bogie 30. The stationary light beam transmitter 246' is configured to emit at least one light beam (e.g., at least two or exactly two light beams) toward the stationary sensor device 243' (shown in FIG. 18 as a solid line from the light beam transmitter 246'). For example, the light beam transmitter 246' has at least one (e.g. at least or exactly two) light beam source which is configured to emit a respective light beam. The travel carriage 10 moves between the stationary sensor device 243' and the stationary light beam transmitter 246', so that the encoder 252' is arranged in a path of the at least one light beam between the stationary light beam transmitter 246' and the stationary sensor device 243'. The coding device 252' further has a plurality of slots (for example in the form of one or more (e.g. mutually offset) series of coding slots, for example, preferably in the form of two mutually offset series of coding slots). The encoder 252' can allow the at least one light beam emitted by the stationary light beam transmitter 246' to pass through the plurality of slots towards the stationary sensor device 243', wherein upon rotation of the bogie 30, light pulses corresponding to the direction of rotation and/or the angle (or rotational path) and/or the rotational speed are generated by means of the plurality of slots of the encoder 252'. The stationary sensor device 243' is configured to receive the generated light pulses (shown in FIG. 18 as a dashed line extending to the sensor device 243') and to determine an angle (or a rotation path) and/or the rotation speed and/or the direction of rotation of the bogie 30 based on the received light pulses. In this regard, for example, to measure the rotational direction-independent angle and/or the rotational direction-independent rotational speed of the bogie 30, a (e.g., a single) light beam emitted by the light beam transmitter 246'' and a (e.g., a single)

series of encoder slots may be used to generate light pulses, and, for example, two light beams emitted by the light beam transmitter 246', and two mutually offset series of encoder slots for generating light pulses for a respective light beam may be used to measure the rotational direction angle and/or rotational speed (or solely the direction of rotation).

In the example according to the invention in FIG. 19, the rotation-measuring device 240 has a stationary (for example with respect to the travel carriage) sensor device 243", a travel carriage light-emitting device 246" mounted on the travel carriage 10, and an encoder 252" rotatably connected to the bogie 30 of the travel carriage 10. The travel carriage light beam transmitting device 246" is adapted to emit at least one light beam (e.g. at least two or exactly two light beams) in the direction of the sensor device 243". For example, the travel carriage light beam transmitting device 246" has at least one (e.g. at least or exactly two) light beam source, which is adapted to emit a respective light beam. The associated encoder non-rotationally fixed to the bogie 30 of the travel carriage 10 252" is arranged in a path of at least one light beam between the travel carriage light-emitting device 246" and the stationary sensor device 243" and has a plurality of slots (e.g. in the form of one or more (e.g. mutually offset) series of coding slots, for example, preferably in the form of two mutually offset series of coding slots). Further, the encoder 252' may let pass the at least one light beam through the plurality of slots toward the stationary sensor device 243' emitted by the travel carriage light beam emitting device 246", wherein upon rotation of the bogie 30, light pulses are generated (shown in FIG. 19 as a dashed line extending toward the sensor device 243") according to the rotation direction and/or the angle (or rotational path) and/or the rotational speed of the bogie 30 by means of the plurality of slots of the encoder 252". The sensor device 243" is also arranged to receive the light pulses generated and to determine an angle based on the received light pulses (or a path of rotation) and/or the rotation speed and/or the direction of rotation of the bogie 30. Also, in the example according to the invention according to FIG. 19, a (e.g., one single) light beam emitted by the travel carriage light beam transmitting device 246" and a (e.g. a single) series of coding slots can be used, for example, for measuring the rotational direction-independent angle and/or the rotation direction-independent rotational speed of the bogie 30, for generating light pulses, and for measuring the rotational direction-dependent angle and/or the rotational direction-dependent rotational speed (or solely the rotational direction), for example, two of the light beams emitted by the travel carriage light beam transmitting device 246" and two mutually offset series of coding slots can be used for generating light pulses for a respective light beam. The travel carriage light beam transmitting device 246" may, for example, include a battery (e.g., a replaceable battery) for supplying electrical energy and/or may be configured to draw from the batter the electrical energy required for operation to the magnetic field of the translation electromagnet devices 130, 140 and/or the rotational electromagnet devices 150, 160.

Figure 20:
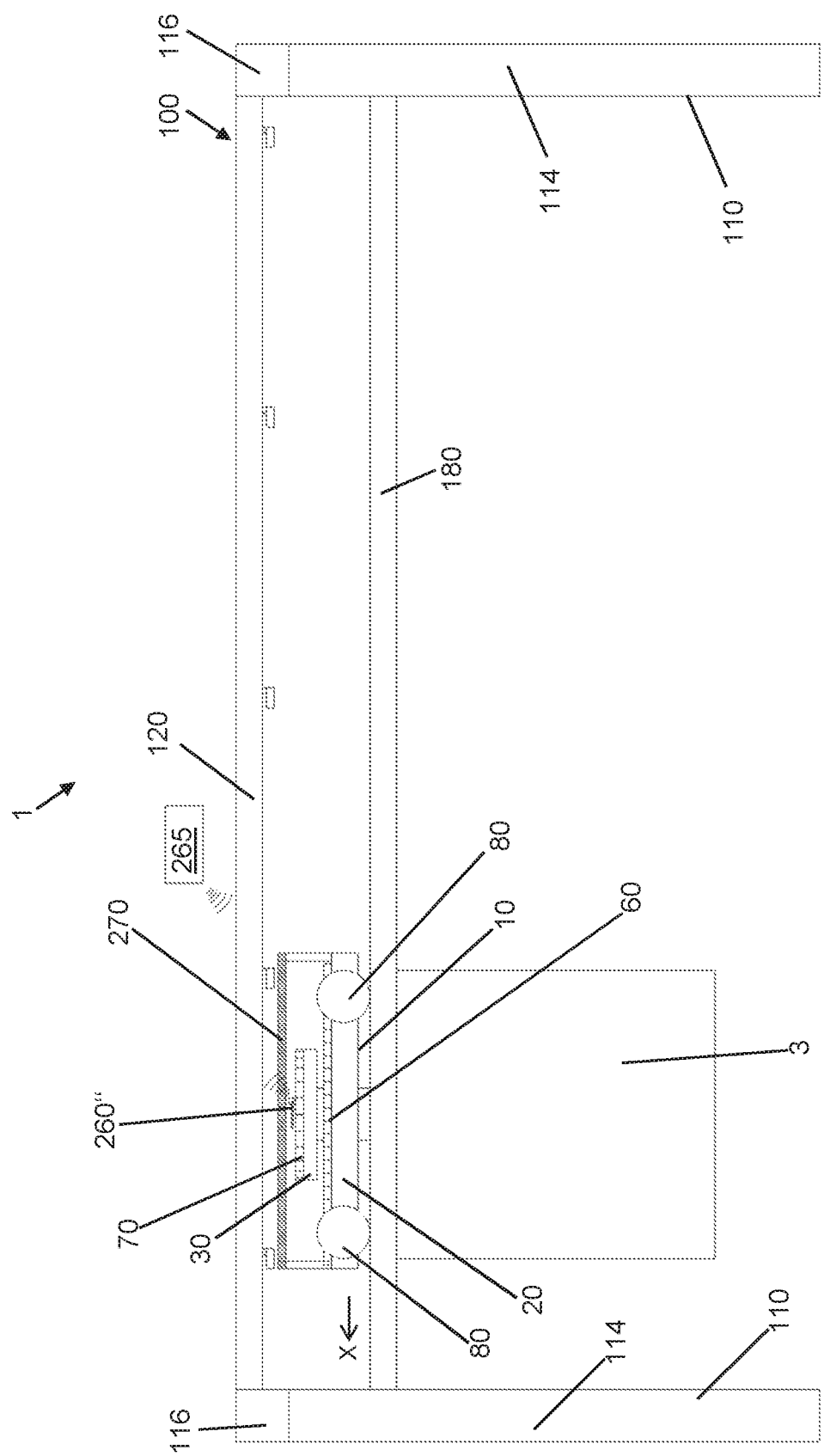

Additionally or alternatively to the above-described optical measuring systems, the rotation-measuring device 240 may have a travel carriage rotation detection device 260 mounted on the travel carriage 10 and a receiving unit 265 connected to the controller 200, as exemplarily shown in FIG. 20. The travel carriage rotation detection device 265 mounted on the travel carriage 10 may be adapted here to detect the angle and/or the rotational speed and/or the direction of rotation of the bogie 30 in any suitable manner (for example, optical, magnetic, etc.), and then to transmit the angle detected and/or the detected rotational speed and/or the detected direction of rotation of the bogie 30 wirelessly (for example in the form of data via radio link) to the receiver unit 265. In turn, the receiving unit 265 transmits the received information regarding the angle and/or the rotational speed and/or the direction of rotation of the bogie 30 to the controller 200. The travel carriage rotation detecting device 260 may include, for example, a battery (e.g., a replaceable battery) for supplying electric power, wherein the battery is mounted on the travel carriage 10. Additionally or alternatively, the travel carriage rotation detecting device 260 may take the electrical energy required for its operation from the magnetic field of the translation-electromagnet device and/or the rotation-electromagnet device. For example, the travel carriage rotation detecting device 260 has a corresponding coil arrangement which magnetically interacts with the magnetic field of the translation-electromagnet device and/or the rotation-electromagnet device, and thereby induces an electric current used to supply the sensor device 260.

In addition, the controller 200 of the device 1 is configured to receive signals which have information regarding a translation path (or a translational position) and a translation direction of the travel carriage 10 from the first translation measuring device 220 and the second translation measuring device 230 and to receive signals which contain information regarding an angle and/or a rotational speed and/or direction of rotation of the bogie of the travel carriage from the rotation-measuring device 240. Furthermore, the controller 200 is configured to control a translational movement of the carriage 10 in response to the signals from the first and second translation measuring devices 220, 230 and to control a rotation of the bogie 30 in response to the signals from the rotation measuring device 240.

Figure 21:
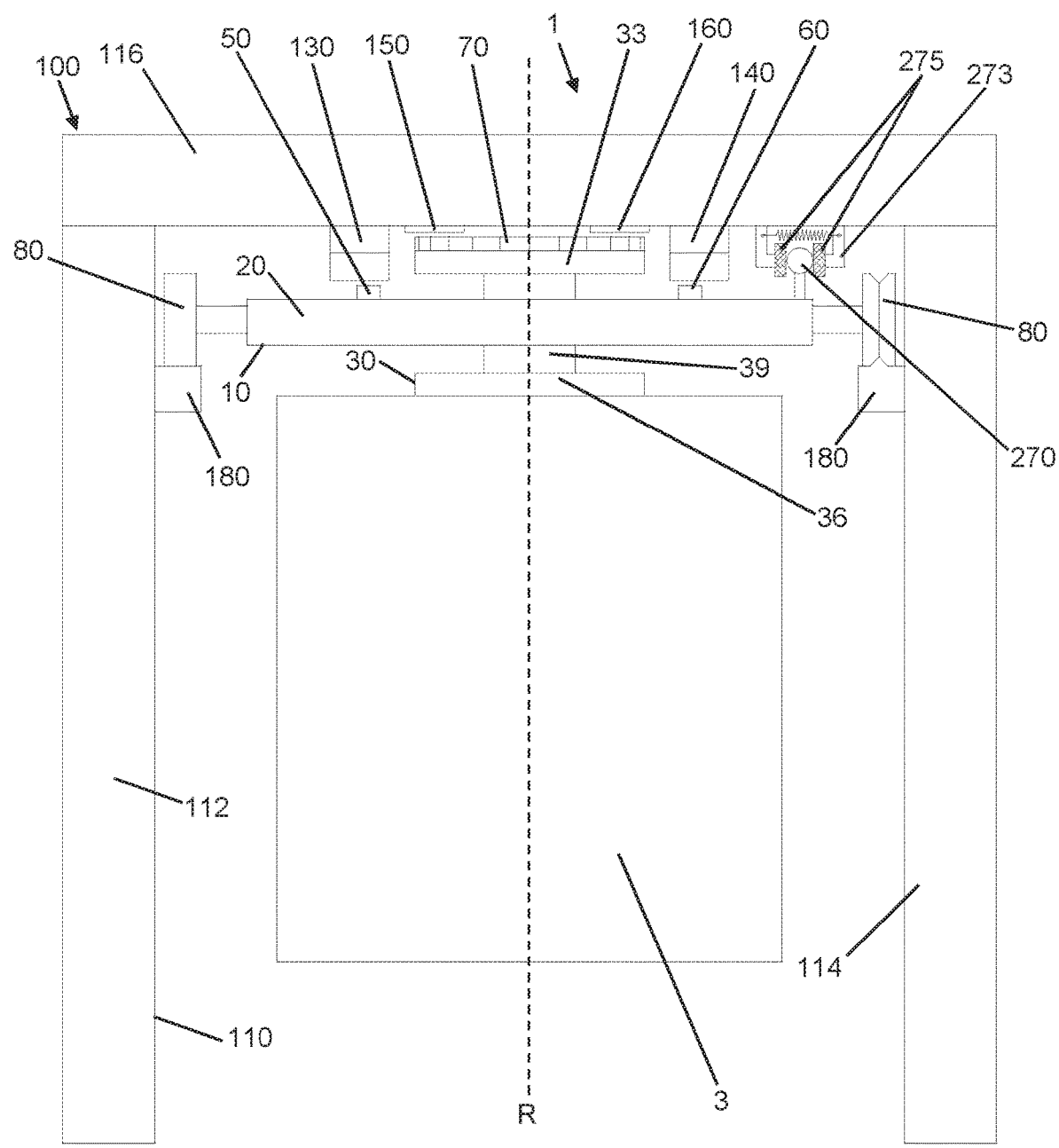
FIGS. 21 and 22 are a cross-sectional view and a side view showing a brake mechanism of an exemplary apparatus for processing a component according to the present invention.
Figure 22:
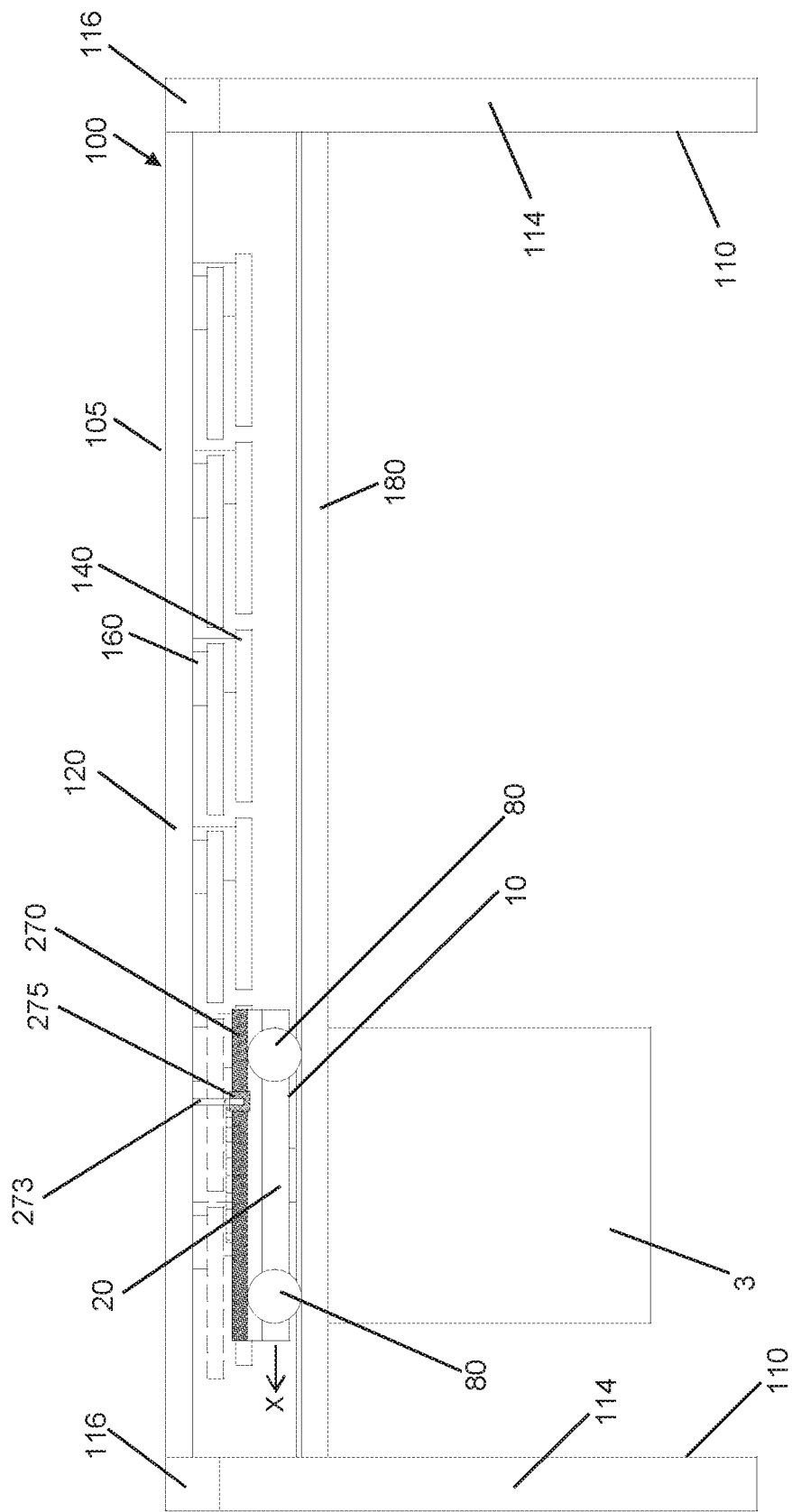

In addition, as shown in FIGS. 21 and 22, for example, a longitudinal brake rail 270 is provided on the frame 20 of the travel carriage 10 and extends along the longitudinal direction X, and the travel carriage guide device 100 further includes at least one brake shoe device 273, for example. For example, the device 1 has a number of brake shoe devices 273. The respective brake shoe device 273 can be attached to the lateral bracket longitudinal members 118, 120 (e.g. by means of an additional cross member between the transverse longitudinal members 118, 120) or can be provided on a respective cross member 116 of a lateral bracket 110 of the device 1 and attached thereto. In the case of several brake shoe devices 273, these can each be provided, for example, on predetermined or on all cross members 116 of the lateral bracket 100 and attached thereto. The brake shoe device 273 has brake shoes 275 arranged on both sides of the longitudinal brake rail 270, by means of which the longitudinal brake rail 270 can be clamped to generate a braking force. The brake shoes 275 of the brake shoe device 273 are biased in the direction of the longitudinal brake rail 270, for example by means of a spring (as shown by way of example in FIG. 21). However, the bias of the brake shoes 275 may be generated in other ways. The brake shoe device(s) 273 is (are), for example, configured to perform a deceleration of the travel carriage 10 in a predetermined error situation (e.g., when an emergency stop switch is actuated and/or in the event of a power failure). For example, during normal operation of the apparatus 1, the brake shoe device(s) 273 is/are adapted to hold the brake shoes 275 of the longitudinal brake rail 270 against the bias and to allow the brake shoes 275 of the longitudinal brake rail 270 to clamp the longitudinal brake rail 270 therebetween due to the bias at a predetermined error situation, generating a braking force. It should be noted that the present invention is not limited to only one longitudinal brake rail 270. Rather, several such brake rails can be attached to the frame 20 of the travel carriage 10 and cooperate in the manner described above with associated brake shoe devices on the travel carriage guide device 100.

The apparatus 1 according to the present invention further includes, for example, one or more process chambers 280 (only one process chamber 280 is shown by way of example in FIG. 23) in which the component 3 is processed (e.g., coated and/or stripped). The process chambers are formed, for example, by process chamber walls 281 and a process chamber bottom 282 and define a respective chamber interior 283 in which a vacuum is created. For this purpose, the apparatus 1 has a vacuum device, by means of which the respective chamber interior of the one or more process chambers 280 can be evacuated. The vacuum device has, for example, one or more vacuum pumps of any type. One or more coating devices, by means of which the component 3 can be coated, are arranged inside (e.g. in the chamber interior) of the one or more process chambers 280. The one or more coating devices are, for example, sputter-coating devices which, for example, respectively have one or more magnetron devices (e.g. sputtering plasma devices). In the present invention, one or more removal devices, by means of which material can be removed from the component 3, are furthermore arranged within (e.g. in the chamber interior) the one or more process chambers 280. The one or more removal devices are, for example, sputter removal devices which, for example, each comprise one or more sputter plasma devices.

In addition, according to the present invention, the device 1 may comprise further chambers/stations, e.g. one or more lock chambers, one or more vacuum preparation chambers (e.g. for preparing (e.g. by heating) the travel carriage and the vacuum component), one or more balancing stations, one or more component mounting stations, and one or more valve device(s), which are adapted to selectively connect two chambers together to allow movement of the travel carriage between the two chambers, and selectively to seal off the two chambers from each other airtight.

Figure 23:
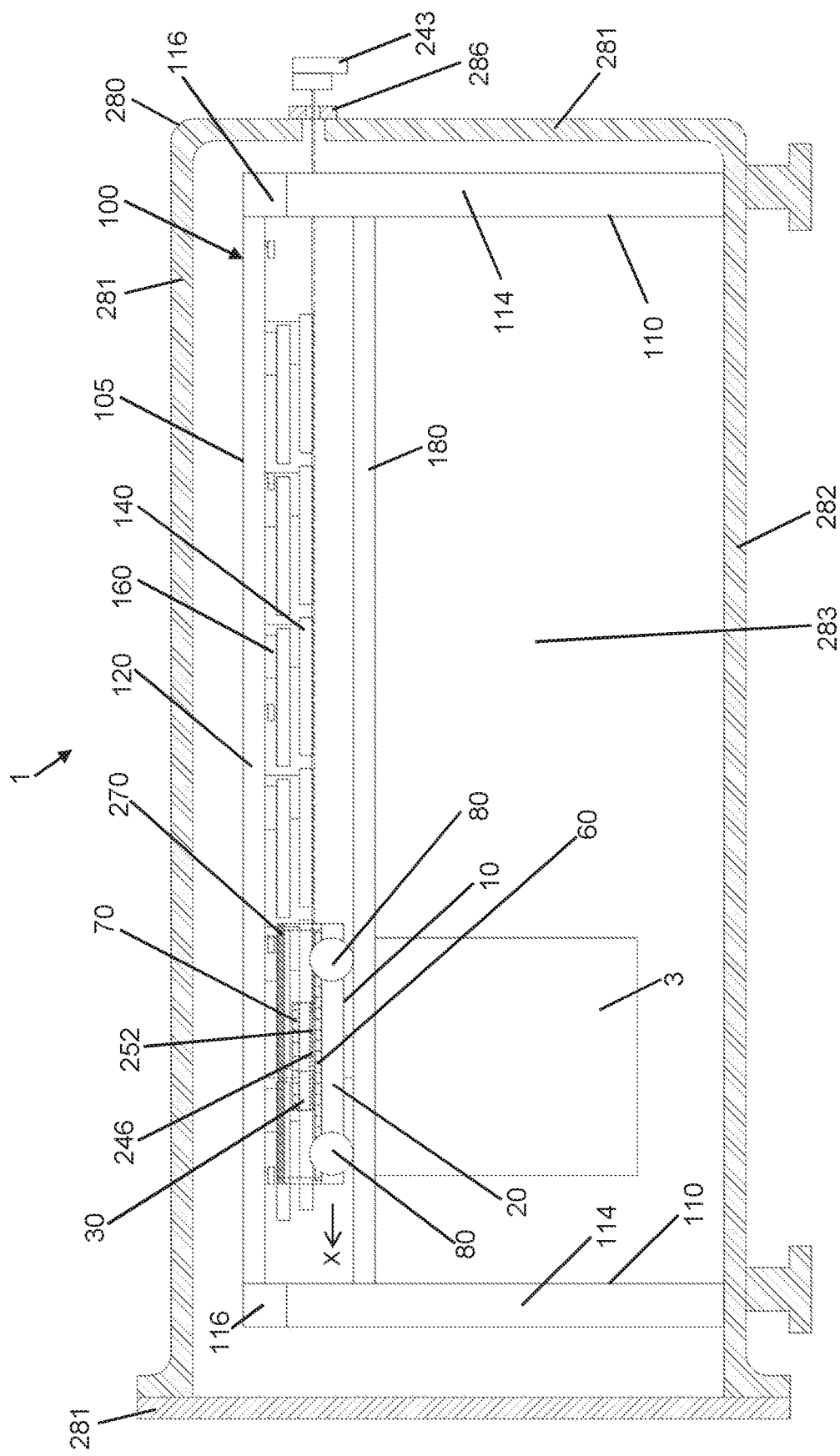
FIG. 23 is another cross-sectional view of an exemplary apparatus for processing a component according to the present invention.

For example, the travel carriage guide device 100 extends with the translational electromagnet devices 130, 140 attached thereto and the rotational electromagnet device 150, 160 mounted thereon (e.g., at least partially) within the one or more process chambers 280 such that the travel carriage 10 guided by the travel carriage guide device 100 can be moved within the one or more process chambers 280 along the translational axis T by means of the first and second translation-electromagnet device 130, 140 translationally and the bogie 30 of the travel carriage 10 can be rotated by means of the first and second rotation-electromagnet device 150, 160 within the one or a number of process chambers 280 about the rotation axis R. FIG. 23 shows by way of example that a module 105 of the travel carriage guiding device 100 extends within a process chamber 280. Furthermore, the travel carriage guiding device 100 with the translation-electromagnet devices 130, 140 attached thereto and the rotational-electromagnet device 150, 160 attached thereto can also extend into or through the further process chamber 280 upstream or downstream further chambers/stations, so that in the same manner as in the one or more process chambers 280, the travel carriage 10 can be moved translationally in these or through these other chambers/stations and the bogie 30 can be set in rotation. For example, one or more modules 105 of the travel carriage guide device 100 in the one or more process chambers 280 upstream or downstream chambers/stations are arranged and interconnected so that the travel carriage 10 can be moved translationally in these or through these other chambers/stations and the bogie 30 can be set in rotation. Thus, with the present invention, it is possible to realize a unitary drive system in all the chambers of the device 1, where no drag chains need to pass over several chambers, or handover of the carriage from one chamber/station to the power supply system of the next chamber/station power supply system is necessary.

Figure 24:
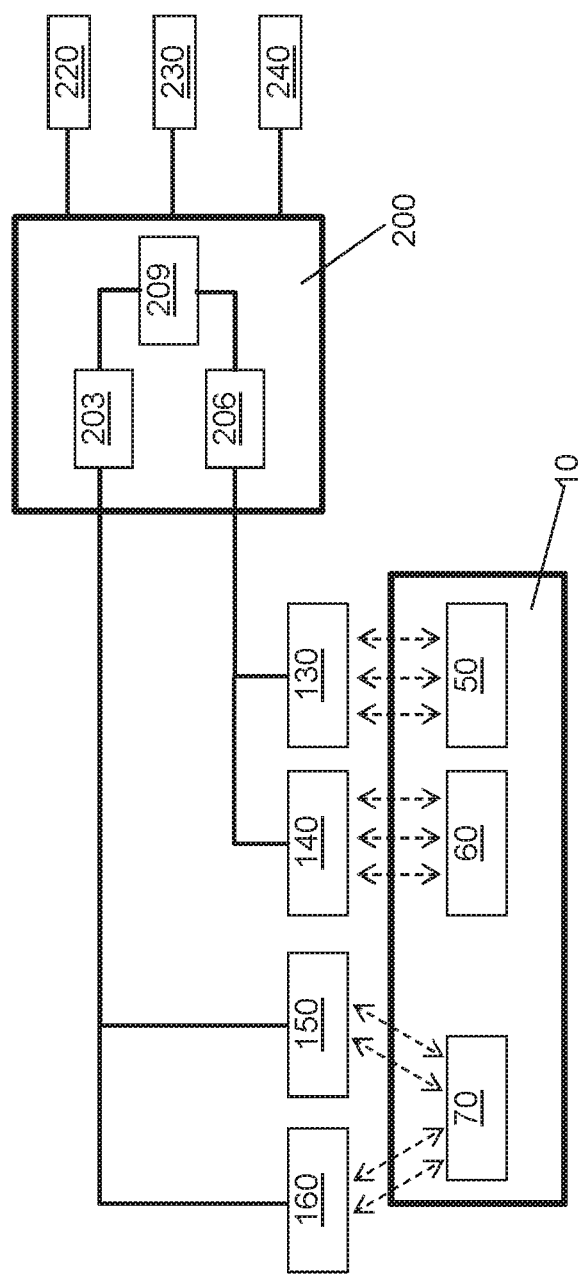
FIG. 24 shows a schematic block diagram illustrating the interaction and operation of the device according to the present invention

In addition, FIG. 24 illustrates the measurement of the rotation of the bogie by means of the example shown in FIG. 17, wherein the stationary sensor device 243" is arranged outside the process chamber 280. As shown by way of example in FIG. 24, the process chamber has a process chamber window 286, which is permeable to a light beam emitted and received by the stationary sensor device 243". For example, the process chamber window 286 is a glass window permeable to the light beam. As a result, by means of the stationary sensor device 243" arranged outside the process chamber 280, the rotation of the bogie can be measured without contact from outside the process chamber 280.

Parts and components of the device 1 may be formed, for example, from vacuum-suitable materials or in vacuum suitable construction. For example, parts and components of the device 1 may be made of vacuum-grade metal material, such as vacuum-grade steel material or aluminum material (e.g., aluminum or an alloy thereof). In particular, the parts of the travel carriage (e.g. frames, rails, etc.) and parts of the travel carriage guide device (e.g., carriers, rails, etc.) may be made of vacuum-suitable steel material or aluminum material (e.g. aluminum or an alloy thereof).

FIG. 24 shows a schematic block diagram illustrating the interaction and operation of the apparatus 1 according to the present invention.

The controller 200 receives from the first translation measuring device 220 and the translation measuring device 230 signals which may have information regarding a translational path (or a translational position) and a translational movement of the travel carriage 10. For example, the controller 200 may receive the translation path (or the translation position) and the translation direction of the travel carriage 10 directly as information from the first translation-measuring device 220 and the second translation-measuring device 230, or the controller 200 may determine the translation path (or translation position) and determine the translation direction of the travel carriage 10 based on the information received from the first translation-measuring device 220 and the second translation-measuring device 230 (e.g. calculate).

The controller 200 also receives from the rotation-measuring device 240 signals that may have information regarding an angle (or a path of rotation) and/or a rotational speed and/or direction of rotation of the bogie 30. For example, the controller 200 may directly obtain the angle (or rotational path) and/or the rotational speed and/or rotational direction of the bogie 30 as information from the rotation-measuring device 240, or the controller 200 may determine the angle (or rotation path) and/or the rotation speed and/or the direction of rotation of the bogie 30 on the basis of the information obtained from the rotation-measuring device 240 (e.g. calculate).

The controller 200 can furthermore be connected to a superordinate control system (not shown) and to receive therefrom setpoints with regard to the translational movement (for example with regard to the desired translation path (or the desired translational position) and a desired translation direction) of the travel carriage 10 and with regard to the rotation (e.g., with respect to the desired angle (or the desired rotational path), the desired rotational speed and/or the desired direction of rotation) of the bogie 30, or calculate those setpoints from data transmitted from the superordinate control system (for example, from information concerning the desired distribution of the material (e.g. a layer thickness profile) on the surface of the component with which the component is to be coated, and/or from information regarding the desired depth of material removal (e.g. a residual thickness profile) of the component).

The superordinate controller 209 of the controller 200 may use the target specifications and the information obtained from the measuring devices to generate respective control signals for the translation controller 203 and the rotation controller 206 and transmit these control signals to the translation controller 203 and the rotation controller 206.

The translation controller 203 implements the control signals of the overlay controller 209 into activation signals for the electromagnets to be activated of the first and second translation-electromagnetic devices 130 and 140, and the rotation controller 206 sets the control signals of the overlay controller 209 into activation signals for the electromagnets to be activated of the first and second rotation-electromagnet device 150 and 160. The electromagnets to be activated (or their electromagnet coils) of the first and second translation-electromagnet devices 130 and 140 and the first and second rotation-electromagnet devices 150 and 160 are thereby supplied with electrical energy by the translation controller 203 and the rotation controller 206 in such a way that a desired translational movement of the carriage 10 and a desired rotation of the bogie 30 is generated.

The respective energized electromagnets of the first translation-electromagnet device 130 interact magnetically (shown in dashed lines in FIG. 24) with the permanent magnets of the first translation-permanent magnet device 50 similar to a linear drive, and the respective energized electromagnets of the second translation-electromagnet device 140 cooperate magnetically with the permanent magnets of the second translation permanent magnet device 60 similar to a linear drive, whereby a driving force for translational movement of the carriage 10 is applied to the frame 20. Further, the respective energized electromagnets of the first rotation electromagnet 150 and the second rotation electromagnet 160 cooperate with the permanent magnets of the rotation-permanent magnet device 60 similar to a linear actuator, whereby a driving force for rotation of the bogie is applied to the bogie 30 relative to the frame 20.

Thus, the travel carriage 10 is translationally moved along the translation axis T in the desired manner (e.g., with respect to the desired translational direction, the desired translation path (or the desired translation position), the desired translational velocity and translational acceleration, etc.), and additionally or alternatively the bogie 30 rotates about the axis of rotation R in the desired manner (e.g., with respect to the desired direction of rotation, the desired angle (or desired rotational path), the desired angular velocity, and the desired angular acceleration, etc.). As a result, the desired translational movement and the desired rotation of the component 3 is generated in a superimposable manner.

For example, a rotation of the component 3 at a constant rotational speed of the component 3 in a rotational direction are generated at a varying speed of translation of the component. 3 Further, a translational movement of the component 3 with constant translational velocity of the component may be generated at a varying rotational speed of the member 3 in a rotation direction.

By corresponding activation of the electromagnets, both a purely translational movement of the travel carriage 10, a pure rotation of the bogie 30 relative to the frame 20 of the travel carriage 10 and a superimposed movement of the translational movement of the travel carriage 10 and rotation of the bogie 30 may thus be generated relative to the frame 20.

The invention claimed is:

1. An apparatus for processing a component, comprising:
a travel carriage with
   a frame defining along a longitudinal direction a translation axis along which the travel carriage is translationally movable forwards and backwards,
   a bogie which relative to the frame about a rotation axis is rotatably connected to the frame and to which the component is attachable,
   a first translation-permanent magnet device which is attached to the frame and which has permanent magnets arranged along the longitudinal direction,
   a rotation-permanent magnet device which is mounted on the bogie, defines a circumferential direction extending around the rotation axis, and has permanent magnets arranged along this circumferential direction, and
   a carriage-side longitudinal guide device which is attached to the frame,
a stationary travel carriage guiding device which has a guide device-side longitudinal guide means which is complementary to the carriage-side longitudinal guide means and by means of which the travel carriage is guided translationally,
a first translation-electromagnet device mounted on the travel carriage guide device and having electromagnets arranged along the longitudinal direction which magnetically cooperate with the permanent magnets of the first translation-permanent magnet device;
a first rotation-electromagnet device mounted on the travel carriage guide device and having electromagnets arranged along the longitudinal direction which magnetically interact with the permanent magnets of the rotation-permanent magnet device, and
a controller, which is connected to the first translation-electromagnet device and to the first rotation-electromagnet device for activating the electromagnets thereof, to follow the translational movement of the travel carriage along the translation axis by means of the magnetic interaction of the electromagnets of the first translation-electromagnet device with the permanent magnets of the first translation-permanent magnet device to control the rotational movement of the bogie about the axis of rotation by means of the magnetic interaction of the electromagnets of the first rotation-electromagnet device with the permanent magnets of the rotation-permanent magnet device.

2. The apparatus according to claim 1, wherein
the travel carriage further comprises a second translation-permanent magnet device mounted on the frame with respect to the longitudinal direction opposite to the first translation-permanent magnet device and having permanent magnets arranged along the longitudinal direction, and wherein
the apparatus further comprises a second translation-electromagnet device mounted on the travel carriage guide device with respect to the longitudinal direction opposed to the first translation-electromagnet device and having electromagnets arranged along the longitudinal direction which interact magnetically with the permanent magnets of the second translation-permanent magnet device, wherein the controller is further connected to the second translation-electromagnet device for driving the electromagnets of the second translation-electromagnet device to control the translational movement of the travel carriage along the translation axis additionally by means of the magnetic interaction of the electromagnets of the second translation-electromagnet device with the permanent magnets of the second translation-permanent magnet device.

3. The apparatus according to claim 1, further comprising:
a second rotation-electromagnet device mounted with respect to the longitudinal direction opposite the first rotation-electromagnet device on the travel carriage guide device and which has electromagnets arranged along the longitudinal direction which magnetically interact with the permanent magnets of the rotation-permanent magnet device, wherein the controller is further connected to the second rotation-electromagnet device for activating the electromagnets of the second rotation-electromagnet device to control the rotational movement of the bogie about the axis of rotation additionally by means of the magnetic interaction of the electromagnets of the second rotation-electromagnet device with the permanent magnets of the rotation-permanent magnet device.

4. The apparatus according to claim 1, wherein the bogie comprises:
a first wheel carrying the permanent magnets of the rotation-permanent magnet device,
a second wheel, which is arranged opposite the first wheel and on which the component can be attached, and
a shaft interconnecting the first wheel and the second wheel,
and wherein the travel carriage has a pivot bearing which rotatably connects the shaft with the frame of the travel carriage.

5. The apparatus according to claim 1, wherein the travel carriage guide device is formed of a frame structure having along the longitudinal direction spaced-apart lateral brackets, which each have lateral posts arranged opposite each other with respect to the longitudinal direction, and having a cross member which extends transversely to the longitudinal direction and connects the posts to each other,
wherein the guide device-side longitudinal guide means is formed of longitudinal rails which are arranged below the cross member, extend along the longitudinal direction and interconnect the lateral brackets, or of rollers which are arranged below the cross member along the longitudinal direction.

6. The apparatus according to claim 1, wherein the carriage-side longitudinal guide means comprises a first carriage-side longitudinal guide means component and a second carriage-side longitudinal guide means component, and the guide device-side longitudinal guide means comprises a first guide device-side longitudinal guide means component and a second guide device-side longitudinal guide means component, and
wherein the first carriage-side longitudinal guide means component and the first guide device-side longitudinal guide means component engage each other to form a transverse fixed bearing and wherein the second carriage-side longitudinal guide means component and the second guide device-side longitudinal guide means component form a transverse floating bearing with each other.

7. The apparatus according to claim 6,
wherein the first guide device-side longitudinal guide means component is formed by a first guide device-side longitudinal rail extending along the longitudinal direction and the second guide device-side longitudinal guide means component is formed by a second guide device-side longitudinal rail arranged opposite the first guide device-side longitudinal rail with respect to the longitudinal direction and extends along the longitudinal direction,
wherein the first carriage-side longitudinal guide means component is formed by at least one roller engaging with the first guide device-side longitudinal rail to form the transverse fixed bearing in a concave-convex engagement preventing play cross to the longitudinal direction, optionally by the opposite first carriage rollers with respect to the first guide-device-side longitudinal rail which are engaged with the first guide device-side longitudinal rail to form the transverse fixed bearing in a concave-convex engagement that prevents play cross to the longitudinal direction, and the second carriage-side longitudinal guide means component is formed by at least one roller engaging with the second guide device-side longitudinal rail to form the transverse floating bearing, optionally by second carriage-side rollers opposite to the second guide device-side longitudinal rail which are engaged with the second guide-side longitudinal rail to form the transverse floating bearing in a play cross to the longitudinal direction permitting engagement.

8. The apparatus according to claim 6,
wherein the first carriage-side longitudinal guide means component is formed by a first carriage-side longitudinal rail extending along the longitudinal direction, and the second carriage-side longitudinal guide means component is formed by a second carriage-side longitudinal rail which with respect to the longitudinal direction is opposite to the first carriage-side longitudinal rail and extends along the longitudinal direction,
wherein the first guide device-side longitudinal guide means component is formed by at least one roller engaged with the first carriage-side longitudinal rail to form the transverse fixed bearing in a concave-convex engagement, optionally by first guide-side rollers, opposite with respect to the first carriage-side longitudinal rail, which with the first carriage-side longitudinal rail form the transverse fixed bearing in a concave-convex engagement that prevents play cross to the longitudinal direction, and the second guide device-side longitudinal guide means component is formed by at least one roller which engage with the second carriage-side longitudinal rail to form the transverse floating bearing in a play cross to the longitudinal direction permitting engagement, optionally by second guide device-side rollers opposite the second carriage-side longitudinal rail which engage with the second carriage-side longitudinal rail to form the transverse floating bearing in a play cross to the longitudinal direction permitting engagement.

9. The apparatus according to claim 1, wherein the electromagnets of the first and/or the second translation-electromagnet device and/or the electromagnets of the first and/or the second rotation-electromagnet device each comprise a housing in which electromagnet coils of the electromagnets are housed, wherein coolant channels are formed in the housing to which a coolant supply can be connected to supply the housing with coolant for cooling the electromagnet coils.

10. The apparatus according to claim 1, further comprising:
one or more process chambers,
a vacuum device by means of which the one or more process chambers can be evacuated,
wherein one or more coating devices, by means of which the component can be coated, are arranged within the one or more process chambers and/or one or more removal devices, by means of which material can be removed from the component, are arranged within the one or more process chambers,
wherein the travel carriage guide device with the attached respective translation-electromagnet device and attached thereto respective rotation-electromagnet device extends at least partially within the one or more process chambers, so that the travel carriage guided by the travel carriage guide device is translationally movable within the one or more process chambers along the translation axis by means of the respective translation-electromagnet device and the bogie of the travel carriage is rotatable about the axis of rotation within the one or more process chambers by means of the respective rotation-electromagnet device.

11. The apparatus according to claim 1,
wherein on the frame of the travel carriage further at least one longitudinal brake rail is mounted, which extends along the longitudinal direction,
and wherein the travel carriage guide device further comprises at least one brake shoe device, which has brake shoes arranged on both sides of the at least one longitudinal brake rail by means of which the at least one longitudinal brake rail can be clamped to generate a braking force.

12. The apparatus according to claim 1, wherein the controller is operable to control at least one of the translation-electromagnet devices and/or at least one of the rotation-electromagnet devices such that the travel carriage translates in a uniform or non-uniform manner and/or the bogie rotates in a uniform manner or in a non-uniform manner and thereby a superimposed movement of translational movement and rotation of the component is generated.

13. The apparatus according to claim 12, wherein the controller is operable to control the translational movement of the travel carriage and the rotation of the bogie in a superimposing manner such that a constant rotational speed of the component in a direction of rotation is generated at a varying translation speed of the component.

14. The apparatus according to claim 12, wherein the controller is operable to control the translational movement of the travel carriage and the rotation of the bogie in a superimposing manner such that a constant speed of translation of the component at a varying rotational speed of the component in a direction of rotation is generated.

15. The apparatus according to claim 12, further comprising at least one translation-measuring device for non-contact measurement of the translational movement of the travel carriage and at least one rotation-measuring device for non-contact measuring of the rotation of the bogie, each being respectively connected to the controller,
wherein the controller is operable to receive signals which contain information regarding a translation path and a translation direction of the travel carriage from the at least one translation-measuring device and signals which contain information regarding an angle and/or a rotational speed and/or a direction of rotation of the bogie of the travel carriage from the at least one rotation-measuring device, and
wherein the controller is operable to control a translational movement of the travel carriage in response to the signals from the at least one translation-measuring device and controls a rotation of the bogie in response to the signals from the at least one rotation-measuring device.

16. The apparatus according to claim 15, wherein the at least one rotation-measuring device is operable to detect the angle and/or the rotational speed and/or the direction of rotation of the bogie optically by means of a stationary sensor device, wherein a measuring distance of the stationary sensor device to the bogie changes as a function of the translational movement of the travel carriage, and/or the at least one rotation-measuring device has a travel carriage rotation-detecting device mounted on the travel carriage and has a receiving unit connected to the controller, wherein the travel carriage rotation-detecting device is operable to detect the angle and/or the rotational speed and/or the rotational direction of the bogie and is operable to transmit the detected angle and/or the detected rotation speed and/or the detected direction of rotation of the bogie wirelessly to the receiving unit and wherein the receiving unit is operable to transmit the received information about the angle and/or the rotational speed and/or the rotational direction of the bogie to the controller.

17. The apparatus according to claim 15, wherein the at least one translation-measuring device of the travel carriage detects the translation path and the translation direction of the travel carriage magnetically and/or optically.

18. The apparatus according to claim 2, further comprising:
a second rotation-electromagnet device mounted with respect to the longitudinal direction opposite the first rotation-electromagnet device on the travel carriage guide device and which has electromagnets arranged along the longitudinal direction which magnetically interact with the permanent magnets of the rotation-permanent magnet device,
wherein the controller is further connected to the second rotation-electromagnet device for activating the electromagnets of the second rotation-electromagnet device to control the rotational movement of the bogie about the axis of rotation additionally by means of the magnetic interaction of the electromagnets of the second rotation-electromagnet device with the permanent magnets of the rotation-permanent magnet device.

* * * * *